United States Patent [19]

Hagiwara et al.

[11] Patent Number: 5,295,296
[45] Date of Patent: Mar. 22, 1994

[54] METHOD AND APPARATUS FOR WORKING A CLAD MATERIAL

[75] Inventors: Katsumi Hagiwara; Akihiro Tanaka; Kou Sasaki; Kiyohito Nagasawa, all of Tanashi; Shin Nemoto; Kazuhiro Yamamoto, both of Suita, all of Japan

[73] Assignees: Citizen Watch Co., Ltd., Tokyo; Sumitomo Special Metals Co., Ltd., Osaka, both of Japan

[21] Appl. No.: 768,278

[22] PCT Filed: Feb. 6, 1991

[86] PCT No.: PCT/JP91/00141
§ 371 Date: Aug. 27, 1992
§ 102(e) Date: Aug. 27, 1992

[87] PCT Pub. No.: WO91/12109
PCT Pub. Date: Aug. 22, 1991

[30] Foreign Application Priority Data

Feb. 6, 1990 [JP] Japan ............... 2-25271
Feb. 6, 1990 [JP] Japan ............... 2-25272
Feb. 6, 1990 [JP] Japan ............... 2-25273

[51] Int. Cl.[5] .............................. H01R 43/00
[52] U.S. Cl. ........................... 29/827; 29/429; 29/779; 29/787; 29/790; 174/52.2; 174/52.4; 437/206
[58] Field of Search ............ 29/827, 879, 462, 428, 29/429, 787, 789, 790, 779, 782; 437/206; 174/52.4, 52.2

[56] References Cited

U.S. PATENT DOCUMENTS

| | | | |
|---|---|---|---|
| 3,559,285 | 2/1971 | Kauffman | 29/827 |
| 3,931,922 | 1/1976 | Jackson et al. | 437/206 X |
| 3,968,563 | 7/1976 | Hamlin | 437/206 |
| 4,458,413 | 7/1989 | Tatum et al. | 29/827 |
| 4,980,219 | 12/1990 | Hiraide et al. | 174/52.4 X |

FOREIGN PATENT DOCUMENTS

| | | | |
|---|---|---|---|
| 55-30859 | 3/1980 | Japan | 437/206 |
| 60-227456 | 11/1985 | Japan | |
| 60-242632 | 12/1985 | Japan | 437/206 |
| 61-20361 | 1/1986 | Japan | 29/827 |

Primary Examiner—Carl J. Arbes
Attorney, Agent, or Firm—Kanesaka and Takeuchi

[57] ABSTRACT

The invention is concerned with a method and an apparatus for working a clad material used as a reed frame for a flat package type integrated circuit. When metal foils of a predetermined size is superimposed at a predetermined position on a strip-like material, press contacted and rolled to produce a continuous clad material, and reference holes are bored in the clad material, not only the relative position between the reference holes but also the relative position between the reference holes and the metal foils previously applied to the clad material may be set accurately. Even if the pitch distances between the reference holes provided in the clad material differ from one another, press working by the metal mold may be continuously performed using these reference holes.

10 Claims, 22 Drawing Sheets

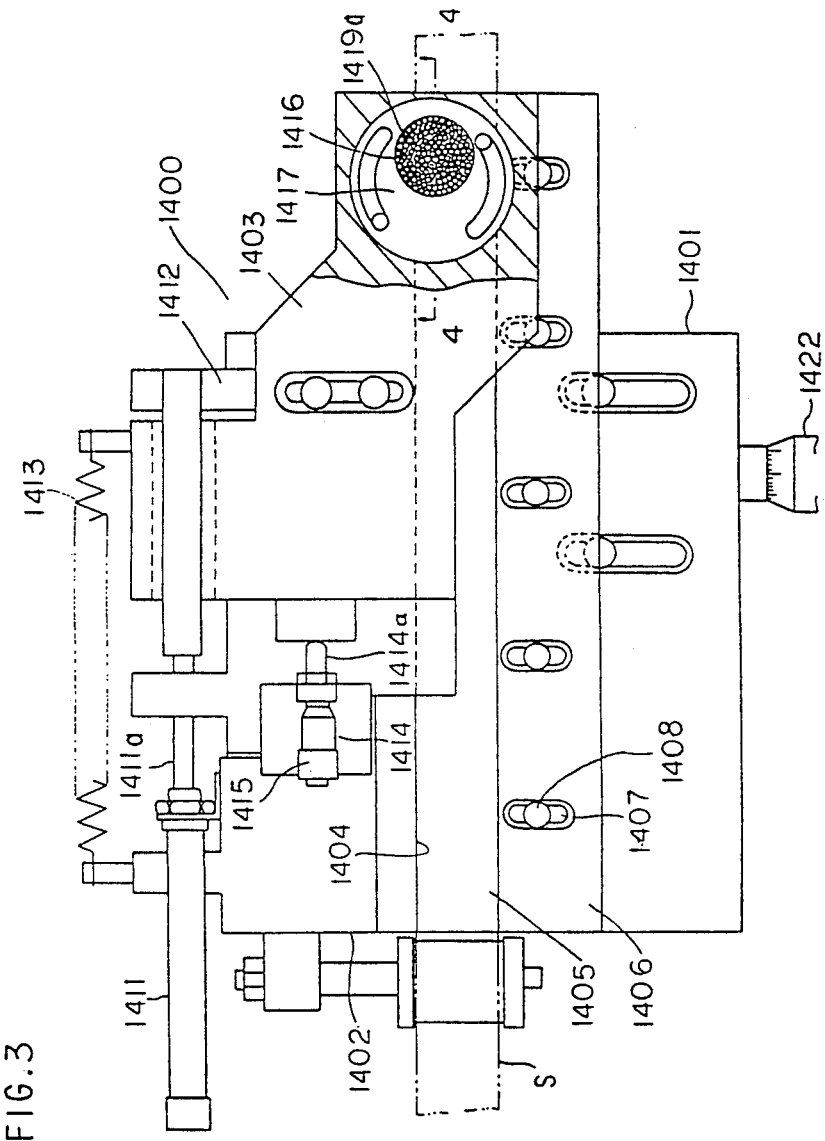

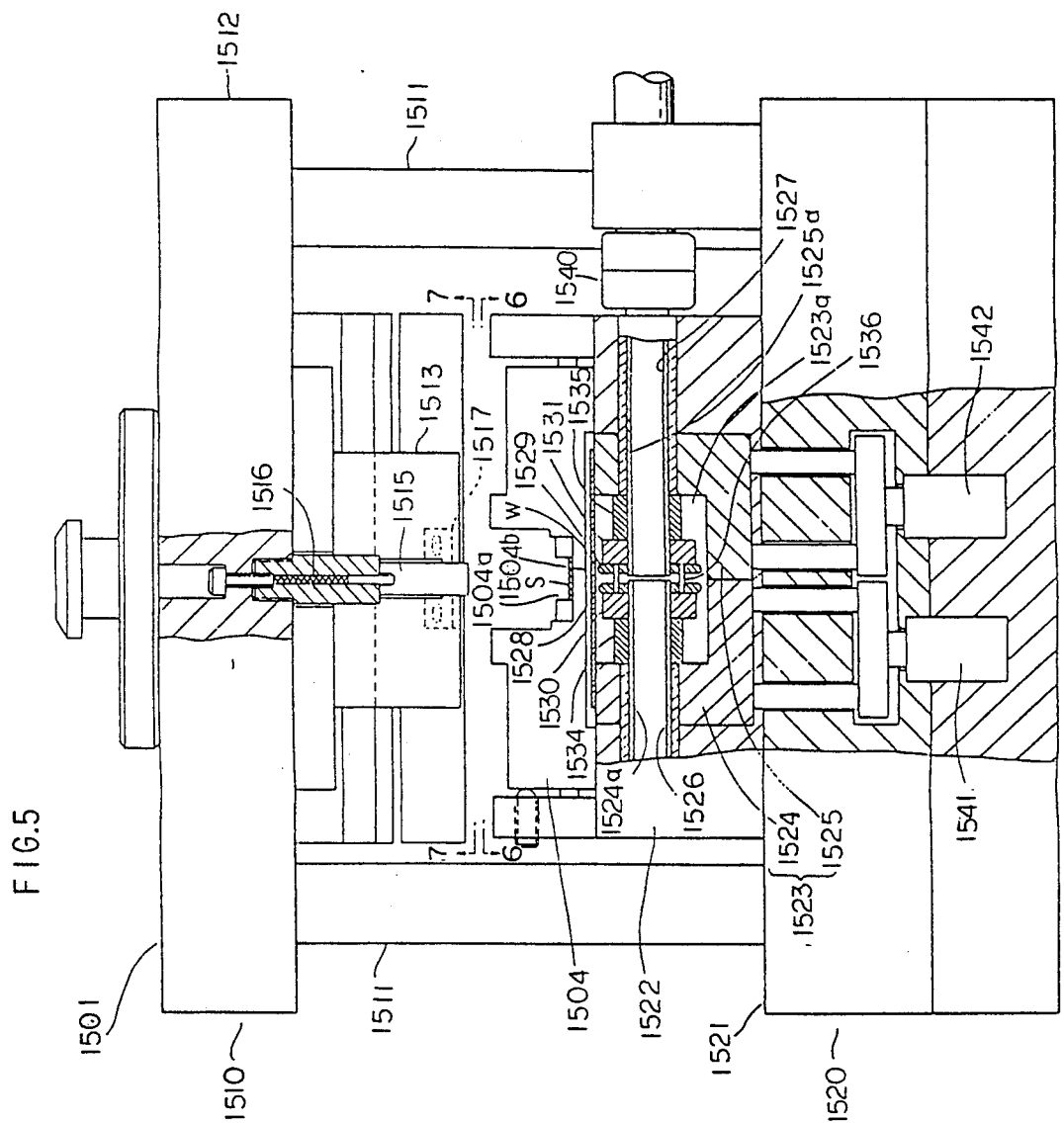

METHOD AND APPARATUS FOR WORKING A CLAD MATERIAL

TECHNICAL FIELD

This invention relates to a method for working a clad material comprising a step of producing a clad material by spot cladding a metal foil on a strip-like material, a step of positionally adjusting reference holes to be bored in the strip-like material on which the metal foil has been clad, and a press working step of making use of the reference holes thus bored in the clad material as the reference, and an apparatus for working a clad material suitable for practicing the method.

BACKGROUND ART

Production Process of a Clad Material

A reed frame for an integrated circuit may be usually fabricated by press working a strip like material W shown in FIG. 26. Those portions of the reed frame which will be used later as bonding sections need to be coated with a metal, such as Al or Ag, for improving adhesivity. For this reason, metal foils S, such as Al or Ag foils, are clad on those portions of the strip-like material W which will be used later as the bonding sections. This material is known as a partially or spot clad material, and, as the methods for producing such spot clad material, methods of "vacuum deposition", "plating" and "rolling-pressure contacting" have hitherto been used.

The method of "vacuum deposition" is however inconvenient in that a costly equipment is necessitated, those portions that are not coated by vacuum deposition need to be masked, and a relatively long time is involved in the operation of vacuum deposition. Namely, productive efficiency is lowered.

The "plating" method is also inconvenient in that certain species of metal to be clad cannot be formed by plating and a limit is imposed on the thickness of the metal layer produced efficiently by plating. Namely, it lacks general applicability.

The "rolling and pressure contacting" method consists in depositing an Al or Ag foil as a stripe on a strip-like reed frame material and mechanically or chemically eliminating unnecessary portions, so that spots of a desired shape will be left, as shown for example in JP Patent KOKAI Publication No. 59-1078 (1984). This method also is not satisfactory in that the yield of metal deposition is low, and an equipment is necessitated for eliminating unnecessary portions by masking. Namely, it causes elevated production costs.

Although the JP Patent KOKAI Publication 60-227456 (1985) teaches a reed frame which may be produced by spot welding an Al foil on a reed frame material and processing the resulting assembly for cladding, this method has not been practically used because of the lack of an appropriate method for positioning and tacking the metal foil at a predetermined pitch. That is, although metal foil pieces of a predetermined length may be applied in position on a sheet material of a predetermined length and processed by pressure contacting and rolling to produce a spot-like or partial clad material of a predetermined length, the clad material can not be produced industrially.

It is an object of the present invention to provide a method and an apparatus for producing a clad material whereby metal foils of a predetermined size may be superimposed on a strip-like material at a constant pitch to enable mass production of a spot or partial clad material with higher accuracy.

Reference Hole Position Adjustment Process

Reference holes bored in a clad material, on which a metal foil is formed previously, are provided at a predetermined pitch, and are used later as working references during working on the clad material.

It is desirable that the distance between the adjacent reference holes be kept at as constant value as possible. The conventional method for adjusting the reference hole positions has been to feed the clad material intermittently at a predetermined interval to a metal mold provided with a perforating punch and a positioning pin and to repeatedly operate the perforating punch and the positioning pin at an accurate timing in synchronism with the movement of the clad material.

With the above described method for adjusting the reference hole positions, the feeding timing of the clad material and the operating timing of the punch may be adjusted accurately, thereby adjusting the distance between the reference holes fairly accurately to a desired value for achieving accurate positioning.

However, such accurate positioning may be achieved only with respect to the distance between the reference holes. If the metal foils have been applied to the material before boring the reference holes, it is extremely difficult with the method of providing constant pitch reference holes to maintain the constant relative position between the metal foils and the reference holes a all times.

It is an object of the present invention to provide a method and an apparatus for adjusting not only the position of the working reference holes relative to one another but also the relative position between the reference holes and the metal foils previously formed on the clad material.

Press Working Process

Press working of a clad material, in which a plurality of reference holes has been formed previously, with the reference holes as a reference for working, has been conventionally performed by providing a plurality of reference holes at a constant pitch in the clad material, introducing reference pins into the reference holes for fixing the position of the clad material with respect to the metal mold, and press working the material in this state by a metal mold.

With this conventional method, the reference holes are provided at all times at an accurately constant pitch, so that, if the reference pins each having a diameter smaller by e.g. 0.01 mm than the hole diameter are fixedly provided at predetermined positions, the reference pins may be accurately engaged with the reference holes.

However, as described under a heading "Hole Position Adjustment Step", under the present status of the art in which the pitch of the reference holes in the clad material fed to the metal mold for press working is not constant but changed, the clad material supplied to the press working step is accurately positioned not only with respect to the relative position between the reference holes but also with respect to the relative position between the reference holes and the metal foils previously formed on the clad material.

If, for press working the clad material by a metal mold with the reference holes as the reference, the reference pins of the metal mold are simply fixed at the predetermined positions during the continuous press working operation, the reference pins are not engaged successfully in the reference holes, thus possibly damaging the clad material or rendering it impossible to perform press working at a desired position.

It is an object of the present invention to provide a method and an apparatus for press working a clad material in which, even though the pitch between reference holes in the clad material is different, press working may be performed continuously by a metal mold using these reference holes.

DISCLOSURE OF THE INVENTION

A first aspect of the present invention resides in a method for producing a clad material by spot cladding metal foils on a strip-like material comprising a material feeding, step for feeding the material to a working position at a predetermined length, a metal foil feeding step for sucking the strip like metal foils by a movable suction member and feeding the metal foils to the working position a metal foil positioning step of re sucking the metal foils by a fixed suction member and setting the metal foils in position on the surface of the material, a cutting step of cutting the metal foils to a predetermined size to form metal foil pieces, a tacking step of tacking the metal foil pieces on the material, and a rolling step of pressure contacting and rolling the tacked metal foils and the material.

In this manner, the metal foils of a predetermined size may be superimposed on a strip-like material to enable mass production of spot or partial clad material with high accuracy.

A second aspect of the present invention resides in an apparatus for working a clad material comprising material supplying means for supplying a strip like material, material feeding means for feeding the material from the material supplying means by steps each of a predetermined length, metal foil supplying means for supplying a strip like metal foil, metal foil feeding means for feeding metal foils from the metal foil supplying means by steps of a predetermined length, cutting and tacking means for cutting the metal foils to produce metal foil pieces, placing the metal foil pieces on the upper surface of the material and tacking the metal foils on the upper surface, and rolling means for pressure contacting and rolling the tacked metal foil pieces and the material.

In this manner, the above method may be executed efficiently.

A third aspect matter of the present invention resides in a method for making hole position adjustment of working reference holes used in press working a clad material produced by the first aspect by a straightforward mold comprising a locating step of setting a relation between the position of a working member for the strip material and the positions of the reference holes to be bored, a reference hole punching step of punching a reference hole in register with a locating position of the working member, a hole position measuring step of measuring an n number of distances between the bored reference holes and the working member, n being a natural number, a processing step of performing an arithmetic operation on the n number of the measured data, and a reference hole position adjustment step of modifying the boring positions with respect to the working member on the basis of the results of the arithmetic operation.

In this manner, even when the metal foils previously formed on the strip-like material are subject to positional fluctuations, the distance between the metal foils and the associated reference holes may be maintained at all times at a target value.

A fourth aspect of the present invention resides in an apparatus for adjusting hole positions of working reference holes arranged on the downstream side of the apparatus according to the second aspect of the present invention comprising monitoring means for determining the relation between the position of the metal foils on the clad material and the positions of the reference holes to be bored, a metal mold for punching the reference holes at the locating positions of the metal foils, a TV camera for measuring an n number of distances between the bored reference holes and the metal foil, controlling means for performing an arithmetic operation on the n number of the measured distance data, and a cam for modifying the boring positions for the metal foils based on the results of the arithmetic operation.

A fifth aspect of the present invention resides in a method for press working a clad material by using a metal mold and by performing position adjustment by reference pins, wherein a plurality of reference holes previously formed in accordance with the method according to the third aspect of the present invention is used as references, comprising a reference hole locating step for setting an initial working position, a hole pitch measuring step for measuring an n number of pitch distances between the reference holes, a calculating step for performing an arithmetic operation of the n number of the measured values of the hole pitch distance data, and a position adjustment step of modifying the relative position between the reference pins and the reference holes on the basis of results of the arithmetic operation.

In this manner, even with different pitch distances between reference holes in the clad material, the reference pins can be accurately engaged at all times in the reference holes to permit a normal press working operation to be performed continuously.

A sixth aspect of the present invention provides a working apparatus for a clad material arranged downstream of the apparatus according to the second aspect of the invention, in which a plurality of reference holes having different pitch distance is formed in the clad material, comprising monitoring means for locating a reference hole for setting an initial working position, a TV camera for measuring an n number of pitch distances of the reference holes, controlling means for performing an arithmetic operation on the n number of the measured hole pitch distance data, reference pins for engaging reference holes in the clad material for positioning the foils on the clad material in position with respect to a metal mold, and a movable member movable on the basis of the results of the arithmetic operation by the controlling means for modifying the relative position between the reference pins and the reference holes.

This enables the method according to the fifth aspect to be executed efficiently.

In the sixth aspect of the present invention, it is desirable that the diameters of the reference pins be changed by a predetermined reference pins along the transport direction of the clad material.

A seventh aspect of the present invention resides in a method for working a clad material produced in accordance with the first aspect of the invention by boring a reference hole with position adjustment in the clad material comprising using a press working metal mold provided with a correcting pin, a perforating punch and a guide pin in this order as viewed from the upstream side, the lengths of the pins and the punch being correlated by the formula of perforating punch <guide pin <correcting pin and the maximum lengths of the pins and the punch as viewed in the clad material feed direction being correlated by the formula of perforating punch >guide pin >correcting pin, lowering the press working metal mold for introducing the correcting pin into the reference hole before re-boring thereof for mechanically correcting an error of partial deviation of the guide hole, introducing and positioning the guide pin in the re-bored reference hole, and re-boring the reference hole corrected during the preceding press working by the perforating punch.

In this manner, when the reference hole as a reference position is bored at a predetermined pitch from the metal foil, the reference hole is bored while the pitch error is corrected.

An eighth aspect of the present invention provides a working apparatus for a clad material arranged downstream of the apparatus according to the second aspect and adapted for boring reference holes with positional adjustment in the clad material, comprising a press working metal mold comprising a correcting pin, a perforating punch and a guide pin in this order from an upstream side, the lengths of the pins and the punch being correlated by the formula of perforating punch <guide pin <correcting pin and the maximum lengths in the feed direction of the clad material of the pins and the punch being correlated by the formula of perforating punch >guide pin >correcting pin, and driving means for lowering the press working metal mold.

This enables the method according to the seventh aspect to be executed efficiently.

BRIEF DESCRIPTION OF THE DRAWINGS

FIGS. 1 to 8 are views for illustrating an apparatus according to the second aspect of the present invention, where FIG. 1 shows a unit for forming a spot clad or partially clad material in its entirety; FIG. 2 is a perspective view showing a metal foil feed means employed in the unit; FIG. 3 is a plan view thereof; FIG. 4 is a cross-sectional view taken along line 4—4 of FIG. 3; FIG. 5 is a side view showing cutting and tacking means, partially broken away; FIG. 6 is a cross-sectional view taken along line 6—6 of FIG. 5; FIG. 7 is a cross-sectional view taken along line 7—7 of FIG. 5; and FIG. 8 is an enlarged cross-sectional view showing an electrode part of the cutting and tacking means.

FIG. 9 to 14 are views for illustrating preferred forms of an apparatus according to the fourth aspect of the present invention, wherein FIG. 9 is a side view showing the apparatus in its entirety; FIG. 10 is a cross-sectional side view showing an embodiment of a metal mold employed in a reference hole punching step in the apparatus shown in FIG. 9; FIG. 11 is bottom view showing an upper metal mold from the bottom side, looking in the direction of arrows 11—11 is FIG. 10; FIG. 12 is a schematic side view showing an embodiment of means for adjusting a position of a reference hole; FIG. 14 is a plan view showing an embodiment of a clad material for application of the present invention.

FIGS. 20 and 21 are views for explaining preferred forms of an apparatus according to the sixth aspect of the present invention, wherein FIG. 20 is a schematic side view of the apparatus and FIG. 21 is a schematic view showing a modification of means for positional adjustment between a reference pin and the reference hole.

BEST EMBODIMENT FOR PRACTICING THE INVENTION

For elucidation of the present invention in more detail, an explanation thereof is given by referring to the accompanying drawings.

Concerning a method and an apparatus for producing a clad material, reference is had to FIGS. 1 to 8 showing a method and an apparatus for cladding a metal foil on a strip-like material.

Figure 1:
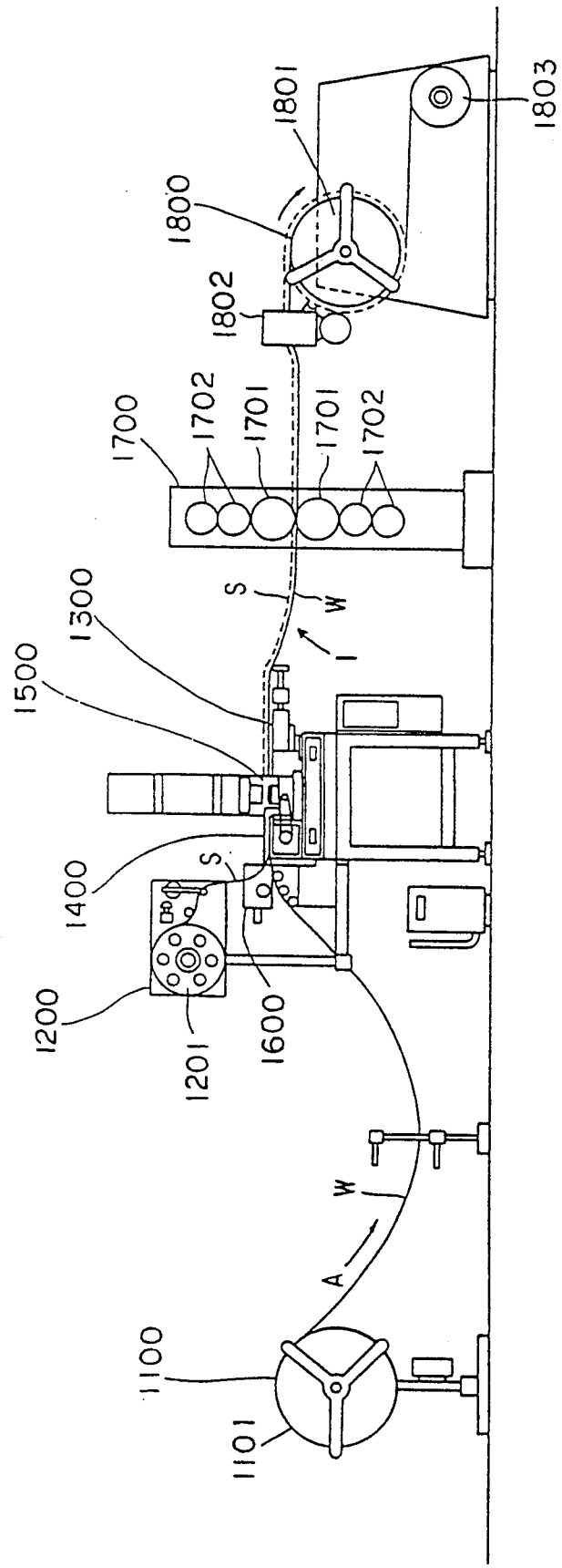

As shown in FIG. 1, the apparatus for producing a spot cladding or partial cladding includes, on a material supply side of a cutting and tacking means 1500, a material supplying means 1100 and a metal foil supplying means 1200, and is adapted to take out a material W and a metal foil S from the supply means 1100 and 1200 by a material feed means 1300 and a metal foil feed means 1400 provided on the cutting and tacking means 1500, respectively. A material cleaner 1600 serves for cleaning the upper surface of the material W supplied to the cutting and tacking means 1500 by a rotary brush and suction by vacuum. A pressure contacting and rolling means 1700 is provided on the delivery side of the cutting and tacking means 1500. The clad material which has passed through the means 1700 is taken up as a product on a take-up means 1800.

The material feed means 1100 is provided with a detachable drum 1101 on which is placed the strip like material W which is taken out by rotation of drum 1101. The metal foil supply means 1200 is provided with a detachable drum 1201 on which is placed the strip-like metal foil S which is reeled out by rotation of the drum 1201. It is noted that the material W and the metal foil S are formed of material suited to the use and application of the clad material to be produced. For a reed frame for IC, for example, a Fe-Ni material and Al or Ag are suitable as the material W and the metal foil S, respectively.

The material feed means 1300 may for example be an air feeder which is known per se. The material W, reeled out from the material supply means 1100 by the material feed means 1300, is intermittently supplied at a constant pitch to the cutting and tacking means 1500.

Figure 2:
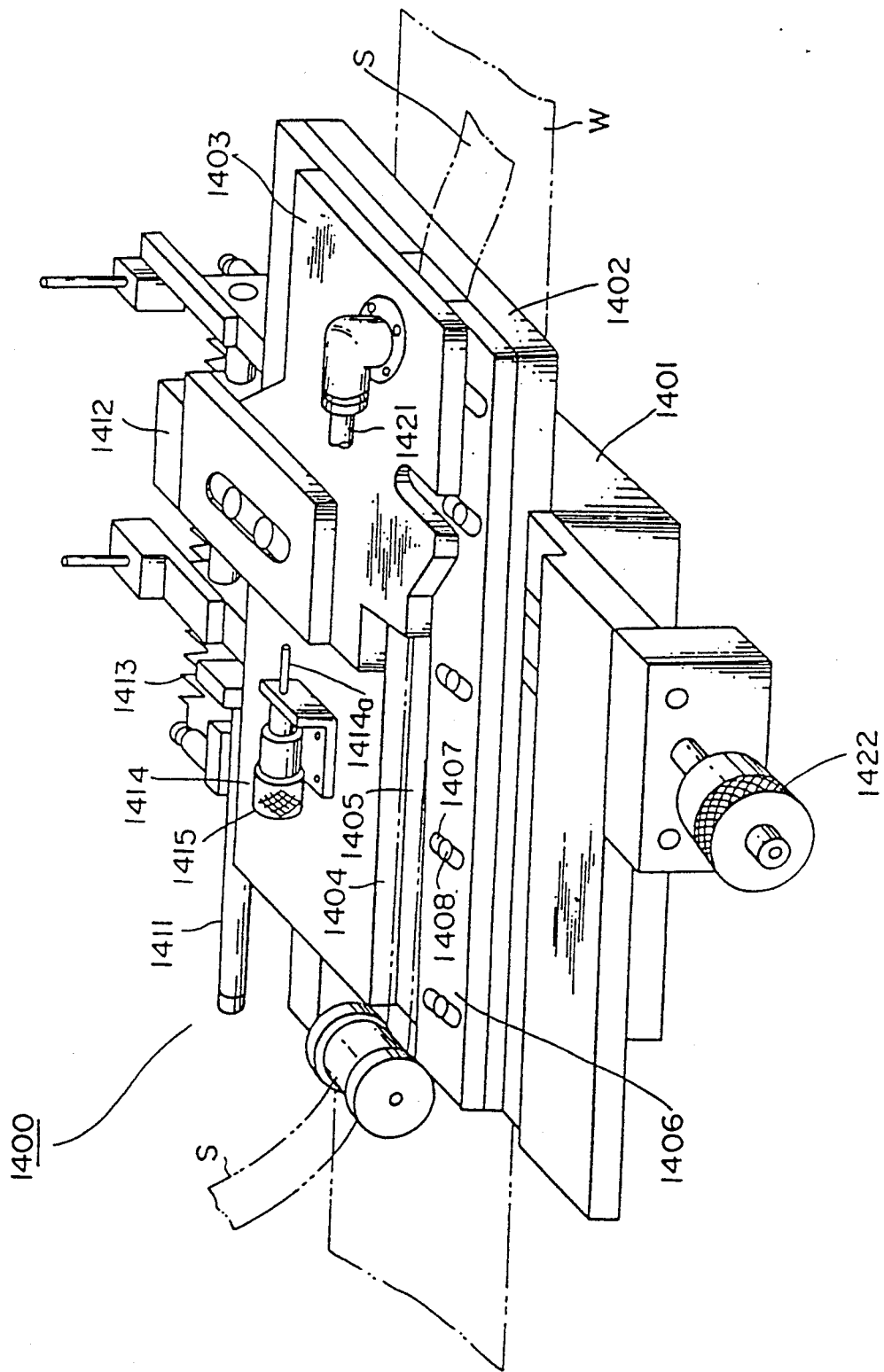

Referring to FIGS. 2 and 3, the metal foil feed means 1400 includes a metal foil guide plate (fixed suction member) 1402 on a base 1401, and a slider (movable suction member) 1403 thereabove.

In the upper surface of the metal foil guide plate 1402, a step 1404 is provided for extending in the fore and aft direction, with the lower surface side of the step 1404 functioning as a guide groove 1405 for the metal foil S. A grove width adjustment plate 1406 is provided on the opposite side of the step 1404, with a guide groove 1405 in-between, so as to be movable along the groove width. That is, the groove width adjustment plate 1406 is formed with several oblong holes 1407 and is secured to the metal foil guide plate 1402 by set screws 1408 engaging in these oblong holes. Thus the groove width adjustment plate 1406 may be moved along the groove width depending on the width of the supplied metal foil S.

A fixed suction member 1409 is formed at a forward end of the bottom surface of the guide groove 1405. The fixed suction member 1409 has a large number of orifices 1409a which are connected to a vacuum suction means, not shown, by means of suction duct 1410 and a piping, not shown. Since the suction pressure by the vacuum suction means is distributed over a large number of orifice 1409a, the metal foil S may be positively and softly adsorbed with the least risk of damage of flexure.

Referring to FIG. 2 and 3, a pneumatic cylinder 1411 is provided on one lateral side of the base 1401 for driving a driving rod 1411a in a feed direction (towards right in FIG. 3). The slider 1403 is attached to the forward end of the driving rod 1411a of the pneumatic cylinder 1411 by means of a connector 1412. The slider 1403 is biased by a tension spring 1413 towards left in FIG. 3. Thus the slider 1403 is moved in the feed direction under a driving force of the pneumatic cylinder 1411, while being receded under the bias of the tension spring 1413. A stop 1414 is provided on the upper surface of the metal foil guide plate 1402 and includes a pin 1414a abutting on the slider 1403 which is at the receded position. Since the pin 1414a has its protruding length changed in the fore and aft direction by a micrometer 1415, the feed pitch of the slider 1403 can be adjusted highly accurately.

Referring to FIGS. 3 and 4, a movable suction part 1416 is provided on the lower surface of the slider 1403. Thus a suction position adjustment disk 1417 is rotatably mounted on the lower surface of the slider 1403. A through hole 1418 is formed in the disk 1417 at a position offset a predetermined distance from its center of rotation. A suction nozzle 1419 having a large number of orifices 1419a communicating with the through-hole 1408 is mounted on the lower surface of the disk 1417. A communicating aperture 1420 communicating with the through-hole 1418 is formed in the lower surface of the slider 1403 contacting with the disk 1417. The communicating aperture 1420 communicates with vacuum suction means, not shown, via a piping 1421.

With the above described arrangement, since the opening position of the suction nozzle 1419 can be adjusted by rotating the disk 1417, the metal foil S can be positively sucked on its central longitudinal axis, even though the foil S is of variable width. Moreover, the metal foil S can be sucked softly and reliably because the suction pressure is distributed over a large number of orifices 1419a.

The base 1401 is formed with a material guide passage, not shown, for guiding the material W along the lower side of the metal foil S. The metal foil guide plate 1402 is movable relative to the base 1401 along the width of the material W. Adjustment of the movement is made by a micrometer 1422. In this manner, the relative position of the metal foil S to the material W may be adjusted highly accurately.

Referring to FIG. 5, the cutting and tacking means 1500 is provided with a metal mold 1501 consisting of an upper mold 1510 and a lower mold 1520.

The lower mold 1520 includes a lower mold block 1521 and a die holder 1522 on the upper surface of the lower mold block 1521. An electrode block is accommodated within the interior of the die holder 1522, and a die 1504 is placed on the upper surface of the die holder 1522.

Figure 8:
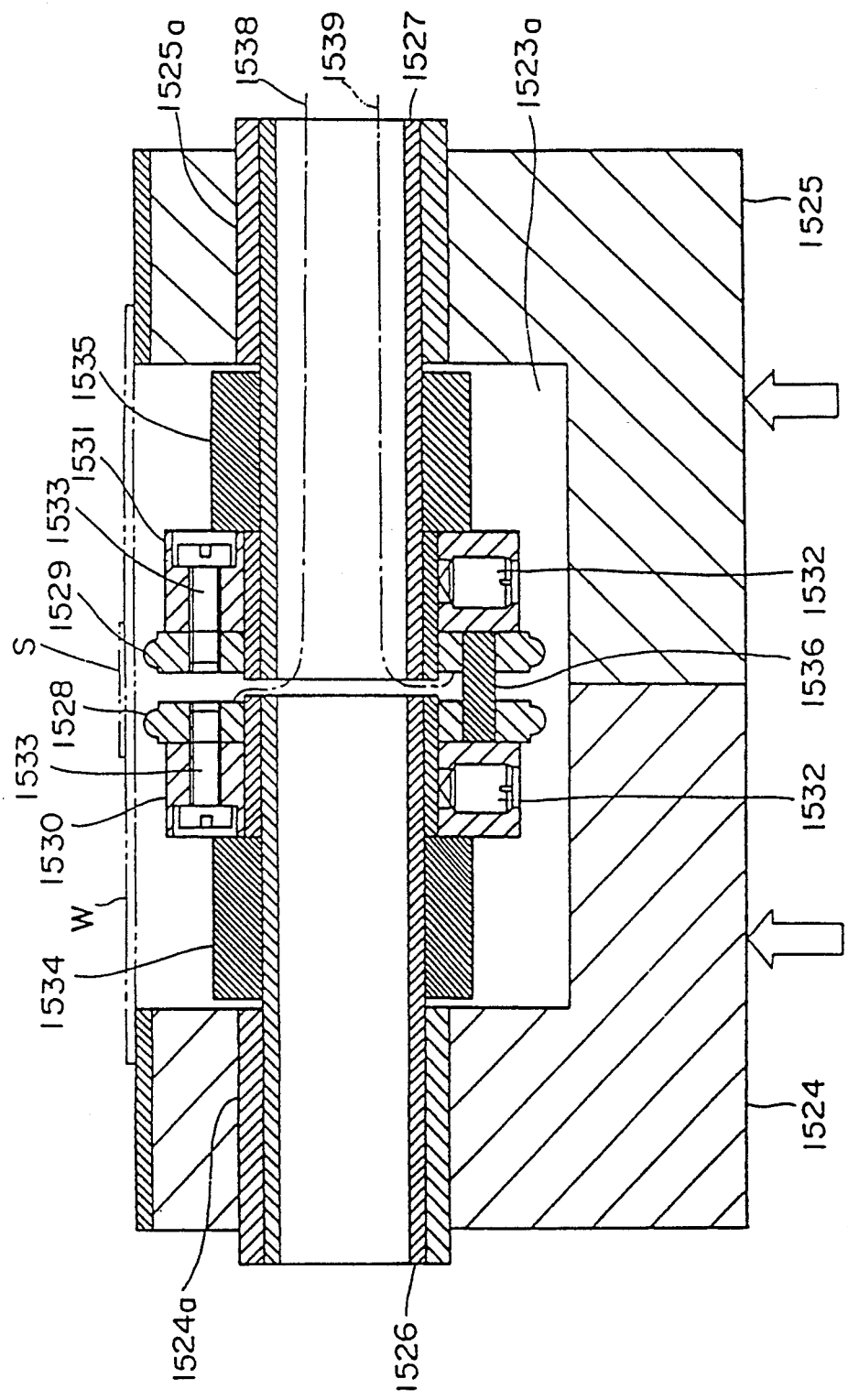

As shown in an enlarged scale in FIG. 8, the electrode block 1523 is divided into two blocks 1524, 1525 along the feed direction of the metal foil S (material W). The blocks 1524 and 1525 are arranged symmetrically in the left and right directions and includes a central groove 1523a and both side bearings 1524a, 1525a. Main spindles 1526, 1527 are rotatably supported by these bearings 1524a, 1525a. Rotary electrodes 1528, 1529 and rotary electrode supports 1530, 1531 are fitted on the ends of the spindles 1526, 1527, respectively. Since the rotary electrode supports 1530, 1531 are secured by set screws 1532, 1532 to the main spindles 1526, 1527, and the rotary electrodes 1528, 1529 are fastened by bolts 1533, 1533 to the rotary electrode supports 1530, 1531, they are not detached from the main spindles 1526, 1527. Insulating spacers 1534, 1535 are interposed between the rotary electrode supports 1530, 1531 and the bearings 1524a, 1525a.

The rotary electrodes 1528 and 1529 are interconnected by two electrode supporting members 1536, 1536, only one of which is shown in FIG. 8. These electrode supporting members 1536, 1536 are formed of soft insulating materials, such as urethane resin. Power source cords 1538, 1539 are connected to the rotary electrodes 1528, 1529. These power source cords 1538 and 1539 are led out of the apparatus via a hollow section of the main spindle 1527 so as to be connected to an electrode, not shown.

The electrode block 1523, in which the rotary electrodes 1528 and 1529 etc. are accommodated, is mounted in the die holder 1522, as shown in FIG. 5. One 1527 of the main spindles is connected to a shaft coupling 1540 of a rotary driving source, not shown. The rotary driving source rotates the main spindle 1527 at a constant velocity, while reversing the direction of rotation at an arbitrary angle, e.g. at an interval of 180°. The rotary force of the main spindle 1527 is transmitted via electrode supporting members 1536, 1536 to the other main spindle 1526. Thus the rotary electrodes 1528, 1529 are rotated in unison with the main spindles 1526, 1527. The result is that the outer periphery of the rotary electrodes 1528, 1529 is worn only evenly due to electrical discharge to prolong the service life. Since the main spindle is reversed in its rotation at an interval of an arbitrary angle, there is no risk of distortion of the power source cords 1538, 1539 passed through the inside of the main spindle 1527.

The electrode blocks 1524, 1525 are separately biased upwards by hydraulic cylinders 1541, 1542, provided within the inside of the lower metal block 1521, respectively.

A metal foil guide groove 1504a is formed at the center of the die 1504 placed on the upper surface of the die holder 1522. The metal foil S is delivered into this guide groove 1504a. A material guide recess 1504b is formed on the lower part of the die 1504. The material W is supplied through the material guide recess 1504b to a space above the rotary electrodes 1528, 1529.

A punch holder 1512 is supported for vertical movement by guide posts 1511 and a punch holder 1513 is provided on the punch holder 1512. The punch 1513 cuts the metal foil S in cooperation with the die 1504. It is noted that the cutting edges of the punch 1513 and the die 1504 intersect each other with a small relative angle of say 1° when viewed in plan so that the punch 1513 and the die 1504 are engaged with each other from one towards the other ends of the edges in the course of the cutting operation. A small relative angles of say 1° is similarly provided when seen from the front side. The result is that the cutting performed by the punch 1513 and the die 1504 is similar to cutting of a paper sheet with scissors to assure positive cutting of the thin-walled metal foil.

Figure 6:
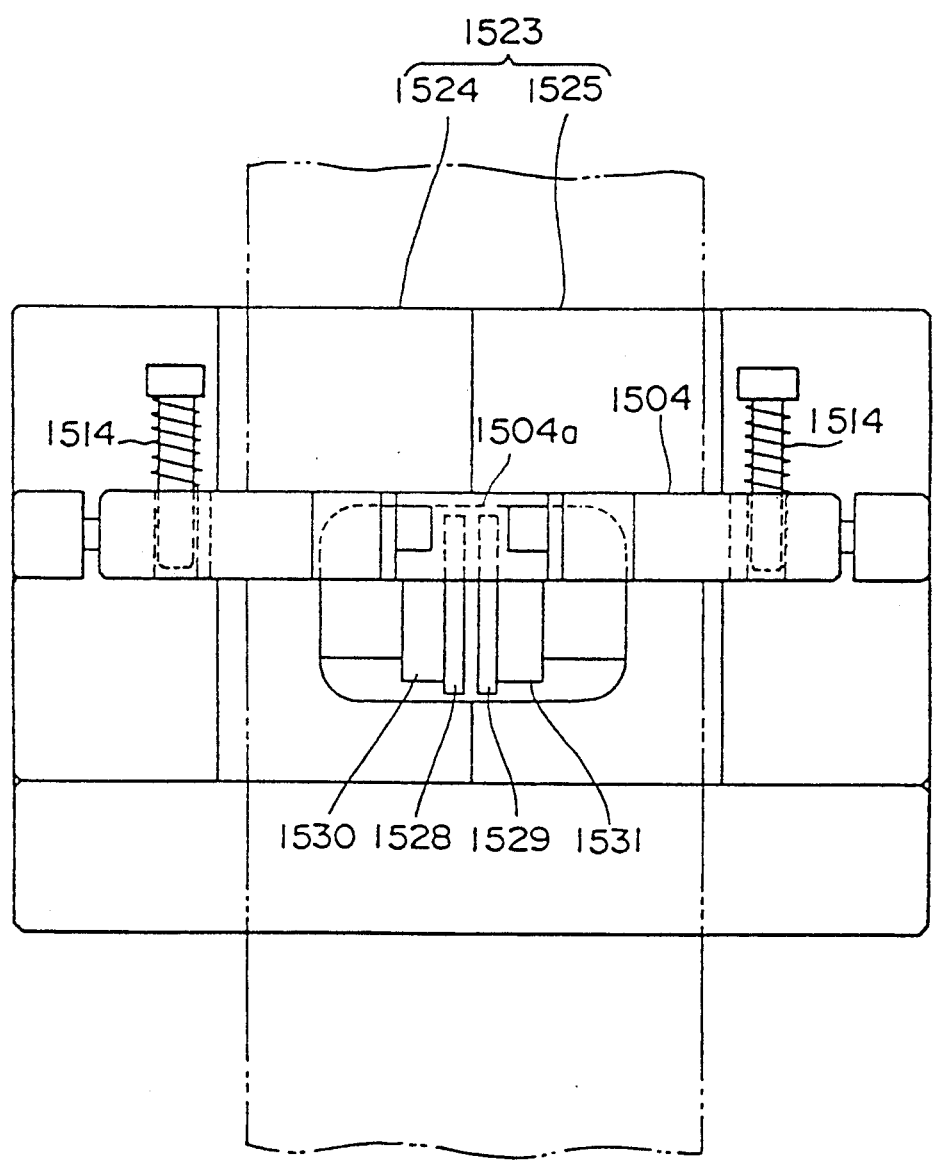

For reasonably performing the cutting operation, the die 1504 is mounted under the bias of compression springs 1514, 1514, as shown in FIG. 6, so that the punch 1513 is moved transitionally against the spring bias during the cutting operation.

Figure 7:
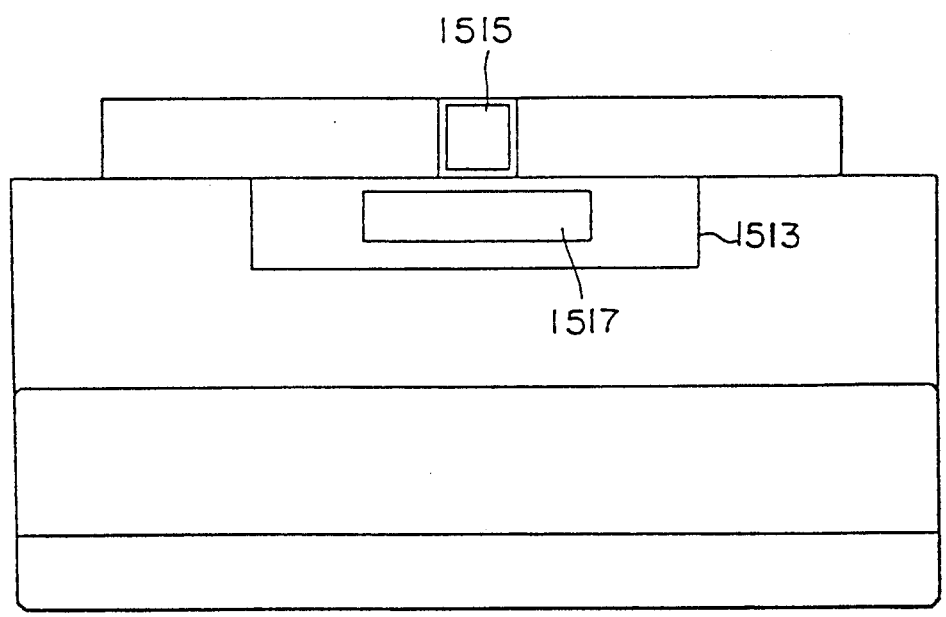

A retention member 1515 is provided at back of the punch 1513 (see FIG. 7). The retention member 1515 is positioned above the guide groove 1504a of the die 1504 with the lower end thereof protruding slightly below the edge of the punch 1513. The retention member 1515 is supported by a spring 1516 and movable vertically. The retention member 1515 is lowered simultaneously with the punch 1513 to thrust and secure the metal foil S against the guide groove 1504a before start of the cutting operation. Thus the metal foil S is accurately cut to size in a state free from bend or distortion and is placed accurately in position on the material W.

An upper half electrode 1517 is provided at a position slightly ahead of the cutting edge of the punch 1513 (see FIG. 7). The upper half electrode 1517 is positioned above the rotary electrodes 1528, 1529 and lowered simultaneously with the punch holder 1512. The upper half electrode thrusts the metal foil S and the material W against the rotary electrodes 1528, 1529 from above. In this manner, the metal foil S and the material W are clamped by the upper half electrode 1517 and the rotary electrodes 1528, 1529 so as to be spot welded to each other.

Referring to FIG. 1, the pressure contacting and rolling means 1700 includes calendering rolls 1701 and backup rolls 1702 and is adapted for passing the material W carrying the metal foil S tacked thereto between the calendering rolls 1701 for pressing and rolling for thereby bonding the metal foil S on the material W. A pressing and rolling load is applied from the backup rolls 1702 to the calendering rolls 1701. This load may be adjusted as desired.

The take-up means 1800 takes up the pressed and rolled clad material on a drum 1801. A tensioning means 1802 is provided ahead of the drum 1801 for placing a constant tension on the product taken up on the take-up means 1800. A separator coiler 1803 having an anti scoring tape wound thereon is provided on the take-up means 1800. The anti-scoring tape is reeled out from the coiler 1803 so as to be supplied to the surface of the product and taken up simultaneously with the product to prevent scoring to the product.

A method of the present invention employing the above described apparatus for producing the clad matieral is hereinafter explained.

The method of the present invention consists of a material feed step, a foil feed step, a foil positioning step, a cutting step, a tacking step and a rolling step.

(1) Material Feed Step

The strip-like matieral W, loaded on the matieral supply means 1100, is reeled out from its free end and forwarded to the matieral feed means 1300 via a material guide passage of the metal foil feed means 1400, material guide recess 1504b of the cutting and tacking means 1500 and a space above the rotary electrodes 1528, 1529. The matieral feed means 1300 transport the matieral W intermittently in a direction A in FIG. in FIG. 1 by steps each of a predetermined length. By this operation, the matieral W is sequentially fed to a position above the rotary electrodes 1528 and 1529 (working position).

(2) Foil Feed Step and Foil Positioning Step

The strip-like metal foil S, loaded on the metal foil supplying means 1200, is reeled out from its free end and forwarded as far as the guide groove 1405 of the metal foil feed means 1400. At the metal foil feed means 1400, the slider 1403 sucks the metal foil S by the movable suction part 1416 at a receded position and is moved forwards by the operation of the pneumatic cylinder 1411. This shifts the metal foil S by a predetermined length (foil feeding step). The fixed suction part 1409, provided on a surface of the guide groove 1405 of the metal foil guide plate 1402, is not in operation for sucking.

The slider 1403 releases the suction state of the movable suction part 1416 at its forward end. Simultaneously, the sucking operation of the fixed suction part 1409 is started for sucking and securing the metal foil S against the fixed suction part 1409 (foil positioning step).

The slider 1403 transfers the metal foil S to the fixed suction member 1409, after which it is again shifted towards its receded position. By the repetition of the sequence of operations, the forward end of the metal foil S is passed through the guide groove 1504a of the die 1504 provided in the cutting and tacking means 1500 so as to be reeled out from the edge of the die 1504 by steps each of a predetermined length, and is placed above the rotary electrodes 1528, 1529 (or at the working position). Meanwhile, the foil feed step and the foil positioning step are carried out simultaneously with the above described material feed step.

(3) Cutting Step

After the metal foil S is placed at the working position, the upper mold 1510 is lowered to effect a cutting. That is, the retention member 1515, punch 1513 and the upper half electrode 1517 are lowered simultaneously with the punch holder 1512 so that, first of all, the retention member 1515 thrusts the metal foil S against the die surface 1504a. The punch 1513 is then engaged with the die 1504 to cut the metal foil S. The so-cut metal foil S is placed on the upper surface of the material W which is at the working position.

(4) Tacking Step

The upper half electrode 1517 is further lowered with the punch 1513 to thrust the metal foil S and the material W, which are at the working position, towards the rotary electrodes 1528, 1529. The metal foil S and the material W are clamped between the upper electrode 1517 and the rotary electrodes 1528, 1529 and maintained under an optimum pressure which is an equilibrium pressure between the pressure applied to the cylinders 1541, 1542 and the pressure exerted by the upper half electrode 1517. A high electrical voltage is applied between the rotary electrodes 1528 and 1529 under application of a constant pressure. Thus a current flows between the electrode 1517 and the rotary electrodes 1528, 1529 to generate Jules heat between the metal foil S and the material W, as a result of which the metal foil S is spot-welded to the material W.

(5) Rolling Step

The material W having the metal foil S tacked (provisionally secured) thereto is fed via cutting and tacking means 1500 to the pressure contacting and rolling means 1700. In the pressure contacting and rolling means 1700, the material W carrying the metal foil S tacked thereto is passed between the calendering rolls 1701, 1701 for pressure contacting and rolling. This stretches the material W to free the material of inundations etc. The metal foil S is brought into pressure contact with the upper surface of the material W and unified with the material W. The material W having the metal foil S clad thereto after the rolling step is taken up on the take-up means 1800.

The above described steps are carried out continuously at a predetermined pitch for cladding the metal foil S on the upper surface of the material W at a predetermined pitch.

It is noted that the method and the apparatus for producing the clad matieral may be changed from those described in the above described preferred embodiment.

For example, any material supply means in the apparatus for producing partial or spot-clad matieral suffices if it is capable of continuously supplying a strip-like material, while any material feed means suffices if it is capable of feeding the material by steps each of a predetermined length and any metal foil supply means suffices if it is capable of continuously supplying a thin-walled strip-like material. As for the pressure-contacting and rolling means, it is possible to use any known means of rolling a metal clad matieral. There is no necessity of continuously proceeding to the rolling step on termination of the tacking step. Thus the material which has passed through the tacking step may be taken up and subsequently reeled out to proceed to the rolling step. The take-up means is not indispensable to the apparatus of the present invention and the clad matieral may be directly transferred to a next step device or unit from the pressure-contacting and rolling step.

Method and Apparatus for Adjustment of the Reference Hole Position

Figure 9:
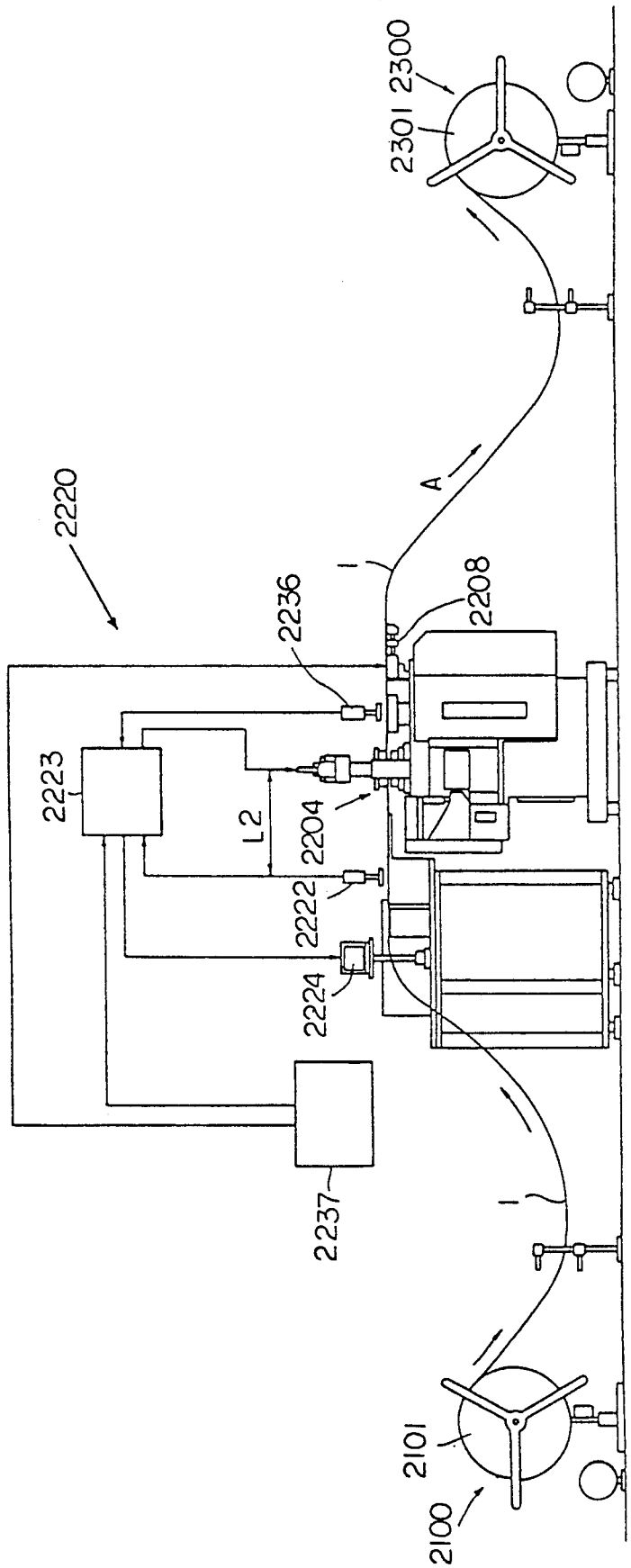
Figure 13A:
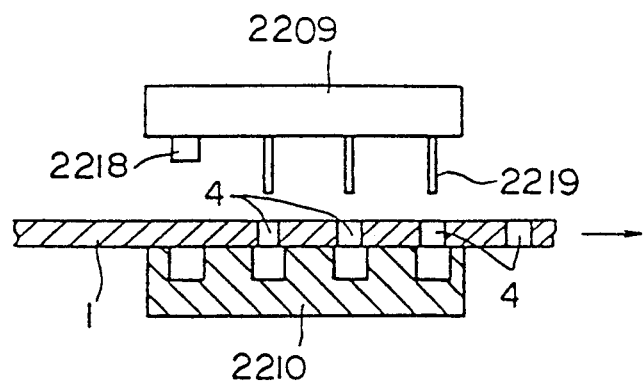
FIG. 13a to 13d are schematic side views showing another embodiment of means for adjusting the position of a reference hole.
Figure 13B:
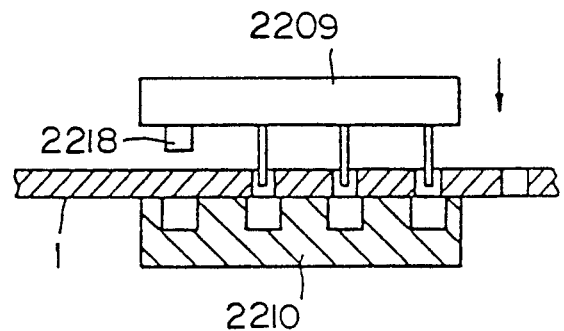
Figure 13C:
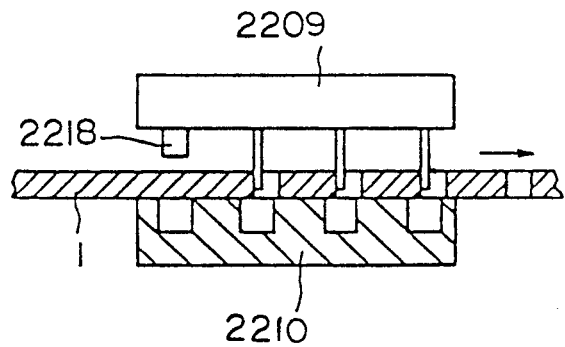
Figure 13D:
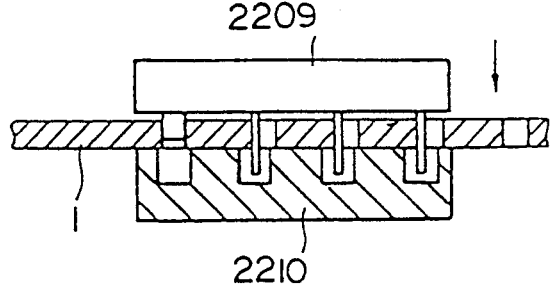

Referring to FIGS. 9 and 13d, a device for adjusting the position of a reference hole provided in the partial spot clad material, is hereinafter explained.

Referring to FIG. 9, a spot-clad material 1 produced by the above described apparatus for producing the clad material is wound on a clad material supply means 2100. A drum 2101 of the clad material supply means 2100 may be the drum 1801 of the take-up means 1800 of the apparatus for producing the clad material.

Figure 14:
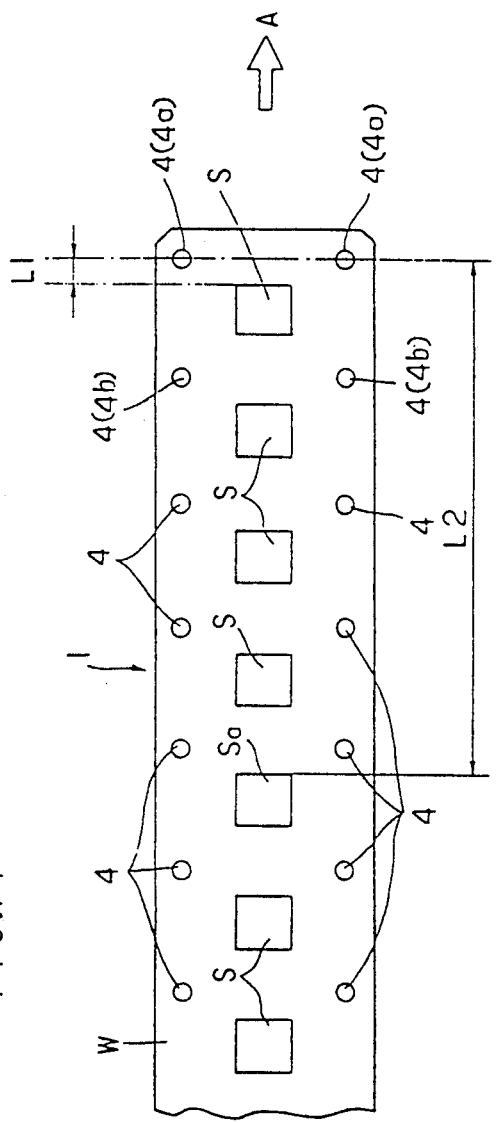

The clad material 1 is intermittently transported in the direction A by an air feeder 2208, as the clad material transporting means, towards a metal mold 2204, which will be elucidated later. Reference holes, not shown, are punched in the clad material 1 by the metal mold 2204, before the material is taken up on take-up means 2301. As shown in FIG. 14, two reference holes 4 are formed on the right side of each Al foil S on the taken-up clad material 1. These reference holes 4 are used as reference holes for subsequent operations performed on the Al foils S on the clad material 1.

Figure 10:
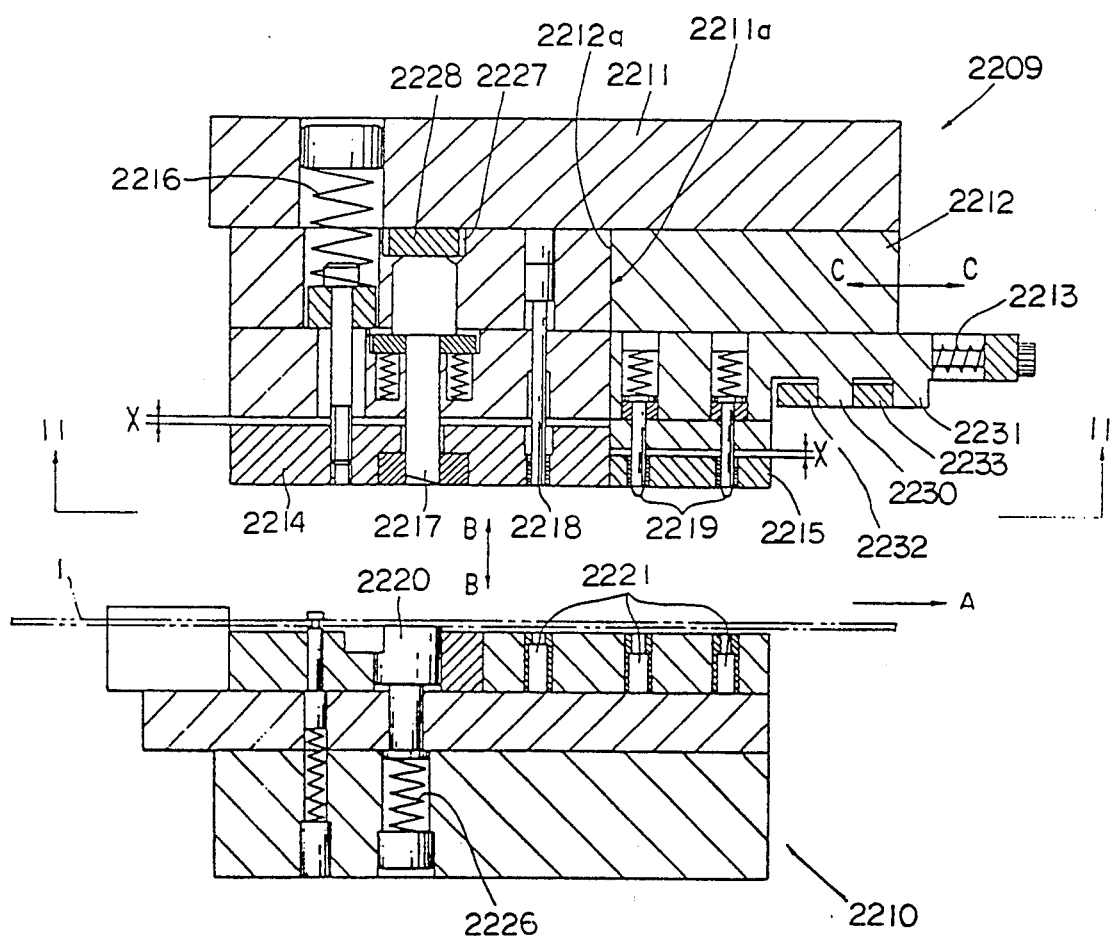

Referring to FIG. 10, the metal mold 2204 has an upper mold 2209 and a lower mold 2210. These mold halves are arranged on both sides of the clad material 1 transported in the direction A for facing each other. The lower mold 2210 is fixed, while the upper mold 2209 may be reciprocated vertically (in the B-B direction) by a press, not shown.

The upper mold 2209 is roughly divided into a main body 2211 and a slider 2212. The slider 2212 is movable in the left and right direction (C-C direction) with respect to the main body 2211 so that a left-hand end 2212a thereof is usually thrust by a spring 2213 against a lower right-hand end face 2211a of the main body 2211.

Pressing members 2214 and 2215 are mounted on the bottom surfaces of the main body 2211 and the slider 2212 at a suitable distance X. The pressing member 2214 of the main body is biased by a spring 2216 downwards, that is, towards the lower mold 2210, while the pressing member 2215 of the slider is also biased downwards by a spring, not shown.

Figure 11:
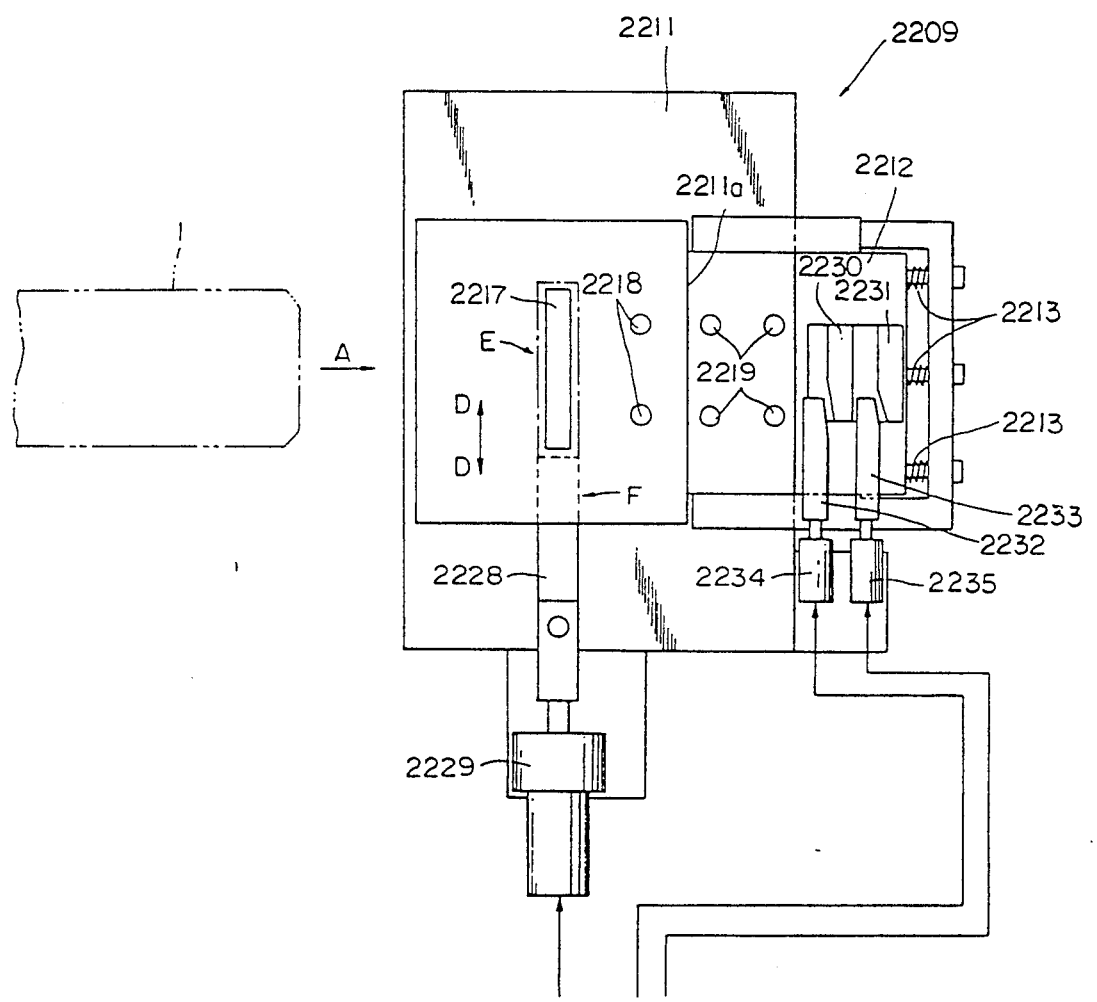

The main body 2211 of the upper mold half is provided with a positioning pin 2219. Turning to FIG. 11, two punches 2218 are provided along the width of the clad material, while two positioning pins 2219 are provided along the width of the clad material. Two punches and four positioning pins along the transport direction of the clad material and along the width of the clad material may naturally be provided. Clearances holes 2221 are formed in the lower mold half 2210 in register with the perforating punches 2218 and the positioning pins 2219.

When the clad material 1 is fed to a predetermined position between the upper mold 2209 and the lower mold 2210 and brought to a standstill, the upper mold 2209 is lowered by a press, not shown, and thrust against the lower mold 2210. At this time, a reference hole 4 (see FIG. 14) is perforated in the clad material 1 by the perforating punch 2218. The positioning pins 2219 are located in another reference holes already perforated by the perforating punch 2218 for positioning the clad material 1 during perforation of the reference holes. Since the above operation is repeated at a predetermined timing as the clad material 1 is intermittently transported in the direction A by air feeder 2208 (FIG. 9), a row of reference holes 4 are formed at a substantially constant pitch in the clad material 1.

Although the Al foils S are provided at a substantially constant pitch on the clad material 1, the pitch is subject to fluctuations if checked extremely minutely. Therefore, even if the interval between the adjoining reference holes 4 is positioned accurately, the relative disposition between the Al foil S and the reference hole 4 is not necessarily constant from one Al foil S to another.

Any fluctuations in the relative disposition of the Al foil S and the reference hole 4 may give rise to hindrances to various operations on the Al foil S in the course of the subsequent process step. In the present embodiment, the following arrangement is used to cope with the fluctuations in the relative disposition between the Al foil S and the reference hole 4.

Figure 15:
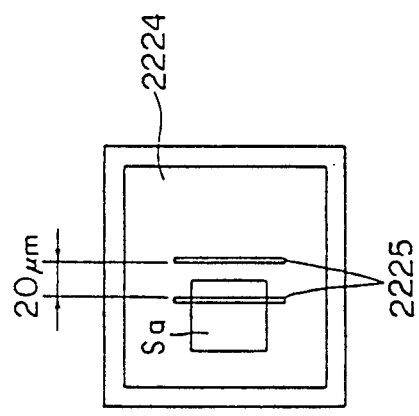
FIG. 15 is a front view showing a monitor as a component employed in a locating step of the apparatus shown in FIG 1.
Figure 16:
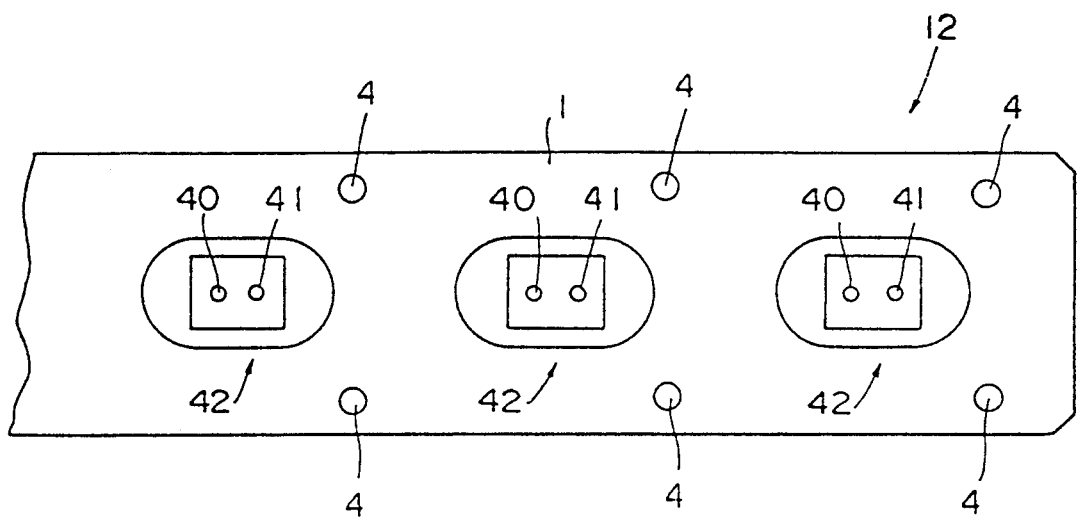
FIG. 16 is a plan view showing an embodiment of application of the invention concerning adjustment of the reference hole position for working a strip other than a clad matieral.

Referring to FIG. 9, a first TV camera 2222 is provided on the left-hand side of the metal mold 2204, that is, towards the upstream side relative to the transport direction A of the clad material. The camera 2222 is designed to pick up an image of the clad material 1 fed into the metal mold 2204 to output corresponding video signals to a control means 2223. The control means 2223, which has received the video signals, displays an image of the clad material, based on the video signals, on a monitor 2224 placed upstream of the first TV camera 2222. Turning to FIG. 15, two locating lines 2225 are displayed at this time at constant positions on the monitor 2224 simultaneously with the image of the clad material. The distance between these locating lines 2225 is set in conformity to the desired positioning accuracy of the reference hole 4. In the present embodiment, the distance is set to 20 82 m.

A second camera 2236, a control means 2223 and a monitor 2224 make up a monitoring means.

As for the metal mold 2204, the upper mold 2209 is provided with a cutter 2217 on the left-hand side of the perforating punch 2218 as shown in FIG. 10. The cutter 2217 is disposed along the width of the clad material, that is, orthogonally relative to the transport direction of the clad material as shown in FIG. 11, and has a length longer than the width of the clad material 1. Referring to FIG. 10, a knock out 2220, biased upwards by a spring 2226, is provided within the lower mold 2210 at a position of facing the cutter 2217.

A flat-plate cam 2228 is provided within a space 2227 provided above the cutter 2217. Referring to FIG. 11, the flat plate cam 2228 is driven by a pneumatic cylinder 2229 into reciprocating movement in the direction shown be arrow D-D, that is, orthogonally with respect to the transport direction of the clad material. By this reciprocating movement, the flat plate cam 2228 assumes two positions, namely an advanced position overlying the cutter 2217, as shown by a chain dotted line, and a receded position, as shown by a solid line and a broken line F.

When the flat-plate cam 2228 is at the advanced position (dotted chain line position) in FIG. 11, movement of the cutter 2217 upwards in FIG. 10 is obstructed by the flat-plate cam 2228, so that, when the upper mold 2209 is at thrust against the lower mold 2201 for perforating the reference hole 4. The clad material 1 is cut by the cutter: 2217. On the contrary, when the flat plate cam 2228 is at the receded position, as shown by the solid line and the broken line F, the cutter 2217 may be moved freely upwards in the space 2227 so that the clad material 1 is not cut even when the upper mold 2209 is thrust against the lower mold 2210. When the reference hole 4 is to be punched, under the normal state, the flat-plate cam 2228 is placed at the receded position of FIG. 11, shown by the solid line and the broken line F, so that the cutter 2217 may be moved freely upwards.

The operation of the pneumatic cylinder 2229 for shifting the flat-plate cam 2228 in the D-D direction is controlled by controlling means 2223.

Referring to FIG. 10, two fixed cams 2230, 2231 are provided on the bottom surface of the slider 2212 parallel to and at a suitable distance from each other. A movable cam 2232 is provided in association with the left side fixed cam 2230 and another movable cam 2233 is provided in association with the right side fixed cam 2231. These movable cams 2232, 2233 are driven by pneumatic cylinders 2234, 2235 secured to the main body of the upper mold 2211 into a reciprocating movement in a direction normal to the transport direction for the clad material (FIG. 11).

In the state shown in FIG. 11, the pneumatic cylinders 2234, 2235 are turned off, with the slider 2212 being at its upstream position of abutting on the right side end face 2211a on the bottom of the main body of the upper mold 2211. When the left side pneumatic cylinder 2234 is turned on from this state, the left-side movable cam 2232 is extended in a direction normal to the transport direction of the clad material (upwardly in the figure) into abutment with the left side fixed cam 2230, as a result of which the slider 2212 is moved towards right in the drawing (towards the downstream side with respect to the transport direction of the clad material) for a suitable distance, such as 5 $\mu$m. If the left side pneumatic cylinder 2234 is turned off and the right side pneumatic cylinder 2235 is turned on, the right side movable cam 2233 is extended and abuts on the right side fixed cam 2231, as a result of which the slider 2212 is additionally moved towards the downstream side for a suitable distance of 5 $\mu$m, giving a total distance of movement equal to 10 $\mu$m. Thus the slider 2212 may take three positions, namely an upstream side position of abutting on the right side end face 2211a on the bottom side of the main body 2211, a central position 5 $\mu$m towards the downstream side from the upstream position, and a downstream position further 5 $\mu$m towards the downstream side from the central position. Since the slider 2212 is movable between these three positions, the positioning pins 2219 mounted on the slider may similarly be moved between the upstream side, central and the downstream side positions, which are spaced by 9 $\mu$m from each other.

In the initial state of boring a hole, the positioning pins 2219 are placed in advance at a central position.

The pneumatic cylinders 2234 and 2235 are connected to control means 2223 so as to be turned on or off under commands from the controlling means.

The second TV camera 2236 is provided on the downstream side of the metal mold 2204 (on the right side of the figure) and on the upstream side of the air feeder 2208. The camera is designed to pick up and image of the clad material which has gone through the step of boring reference holes 4 and transmits the corresponding video signals to the controlling means 2223. The controlling means 2223, which has received the video signals for the clad material from the second TV camera 2236, calculates, on the basis of the video signals, a distance L1 between the forward end of each Al foil S and the centers of the reference holes 4 in FIG. 14. The controlling means then controls the pneumatic cylinders 2234 and 2235 of FIG. 11 on and off, based on the calculated results, for adjusting the positions of the positioning pins 2219. For such position control of the positioning pins 2219, the clad material 1 is offset towards the upstream or downstream sides relative to its transport direction during perforation of the reference holes 4 by the perforating punch 2218 for adjusting the position of the reference hole 4 relative to the Al foil S.

A specific example of hole position adjustment to be executed by the controlling means 2223 and a flow of the perforating operation for the reference hole 4, are hereinafter explained.

(1) Locating Step for Clad Material

In FIG. 9, the clad material 1, supplied from the supplying means 2100, is taken up via metal mod 2204 on take up means 2300. In this state, the clad material 1 is transported automatically intermittently by the air feeder 2208. However, at the start of a reeling out operation of the clad material 1 from the cladding supplying means 2100, the clad material 1 has not arrived at the air feeder 2208, so that the clad material 1 must be fed manually into the metal mold 2204 until start of an automatic transport by the air feeder 2208.

Also, when perforating the first reference hole 4, the distance between the hole 4 and the Al foils must be set accurately.

With the present embodiment, an operator manually feeds the clad material 1 into the metal mold 2204, while he monitors the feeding operation on the monitor 2224. When the forward end of the clad material 1 reaches the metal mold 2204, an Al foil Sa, which is located at a position by a distance L2 from the first TV camera 2222 as measured from the center of the punch 2218 of the metal mold 2204, is displayed on the monitor 2224. The operator sets the position of the clad material 1 so that the forward end of the Al foil Sa is positioned between the two locating lines 2225 displayed on the monitor 2224.

After position setting of the clad material 1, the operator actuates an actuating button, not shown, provided on a press operating part 2237. The upper mold 2209 in FIG. 10 is lowered by this actuation for perforating first reference holes 4 at a target position.

The operator then advances the clad material 1 by a distance between the two adjoining Al foils S by relying on his visual sense and actuates an actuating button of the press actuating part 2237. This perforates the second reference holes 4b by the lowering of the upper mold 2209 at a second time. Since the first reference holes 4a are already perforated in the clad material 1, and the positioning pins 2219 on the upper mold 2209 are engaged in these holes, the reference holes 4b may be located accurately with respect to the Al foil S.

The above operation by the operator is repeated until the forward end of the clad material 1 reaches the air feeder 2208. After the clad material 1 has been supported by the air feeder 2208, the clad material 1 is transported continuously intermittently by the air feeder 2208 such that perforation of the reference holes by the metal mold 2204 is executed automatically under control by the controlling means 2223.

(2) Adjustment Step of Reference Hole Positions

Turning to FIG. 9, the second TV camera 2236, placed on the upstream side of the air feeder 2208, transmits an image of the clad material formed with the reference holes 4 to the controlling means 2223, which then calculates the distance L1 between the reference holes 4 and the Al foil S on the basis of the video signals. This operation is carried out for each of an n number of reference holes 4, where n is a natural number which may be set to a proper value depending on the quality of the clad material 1.

In a data table within the controlling means 2223, the following five reference values concerning the distance between the reference holes and the Al foil are stored.
target distance value
plus side first limit value: +a
plus side second limit value: +b
minus side first limit value: −a
Minus side second limit value: −b The plus side first limit value +a and the minus side first limit value a are equal in magnitude and opposite in polarity. Similarly, the plus side second limit value +b and the minus side second limit value −b are equal in magnitude and opposite in polarity. The relative magnitude between a and b is a<b.

The controlling means 2223 compares the n number of the calculated values of the distances L1 of the reference holes respectively to the above target value and calculates the deviations from the target value. The controlling means then calculates the means value of the n number of deviations from the target value. The calculated mean deviation value is compared to the above limit values +a, +b, −a and −b. Based on the results of comparison, the controlling means 2223 controls the pneumatic cylinders for adjusting the positioning pins 2234, 2235 and the cutter 2217 of FIG. 1 in the following manner.

i) If the mean deviation value Va is between the plus and the minus side first limit values +a and −a (−a<Va<+a), the pneumatic cylinders 2234, 2235 are maintained in their preceding states.

ii) If the mean deviation value Va exceeds the first limit values +a and −a but is less than the second limit values +b and −b ( b<Va<−a or +a<Va<+b), the position of the perforated reference hole 4 is determined to be deviated beyond the allowable range with respect to the associated Al foil S, and the position of the positioning pins 2219 of FIG. 11 is changed. That is, if the mean deviation value Va exceeds +a (first limit), the distance between the foil and the hole is determined to be enlarged and accordingly the left side pneumatic cylinder 2234 of FIG. 11 is turned off while the right side pneumatic cylinder 2235 is turned on to shift the positioning pin 2219 towards the downstream side position ( towards right in the drawing). In this manner, the Al foil S to be perforated next is drawn to close to the punch 2218.

If the mean deviation value Va is not more than −a (first limit value), the distance between the foil and the hole is determined to be reduced. Thus the pneumatic cylinders 2234 and 2235 are both turned off to shift the positioning pins 2219 to its upstream position (the position shown).

By shifting the positioning pins 2219 in this manner, the distance between the foil and the hole may be reset to the target value.

iii) If the mean deviation value Va exceeds the plus and minus limit values +b and −b (Va<−b or +b<Va), the position of the reference hole 4 is corrected under the usual occasions to the target position by the above control ii). However, in an abnormal case in which, for example, the position of the Al foil S on the clad material 1 is subject to extremely large fluctuations, the reference hole position can not be corrected even by the above control ii), such that the mean deviation value Va exceeds the second limit value +b or −b. In this case, the controlling means 2223 leaves the adjustment pneumatic cylinders 2234, 2235 intact and turns the pneumatic cylinder 2229 for the cutter on to project the flat plate cam 2228 to a position overlying the cutter 2217. This cuts the clad material 1 to prevent defective clad material 1 with the abnormal reference hole position from being fed to the next step.

With the above described embodiment, the position of the metal mold 2204, particularly the position of the positioning pin 2219 within the upper mold 9, is controlled by controlling means 2223. The result is that the distance between the Al foil S and the reference hole 4 may be maintained at a constant value even though the position of the Al foil S on the clad material 1 is subject to fluctuations.

It is noted that the controlling means 2223 measures the n number of reference hole positions and calculates a mean value which then is compared to the limit values +a, −a, +b and −b. If the respective reference hole positions exceed the limit values, but the mean value is not in excess of the limit values, the operational control of the pin position adjustment pneumatic cylinders 2234, 2235 and the pneumatic cylinder for cutter 2229 is not executed.

Meanwhile, the method as well as the apparatus for adjusting the hole positions may be changed from the preferred method and apparatus described above.

For example, although the mean value of the n number of the measured values is taken and used for control in the above explanation, the value used for control may be any other value than the mean value.

Figure 12:
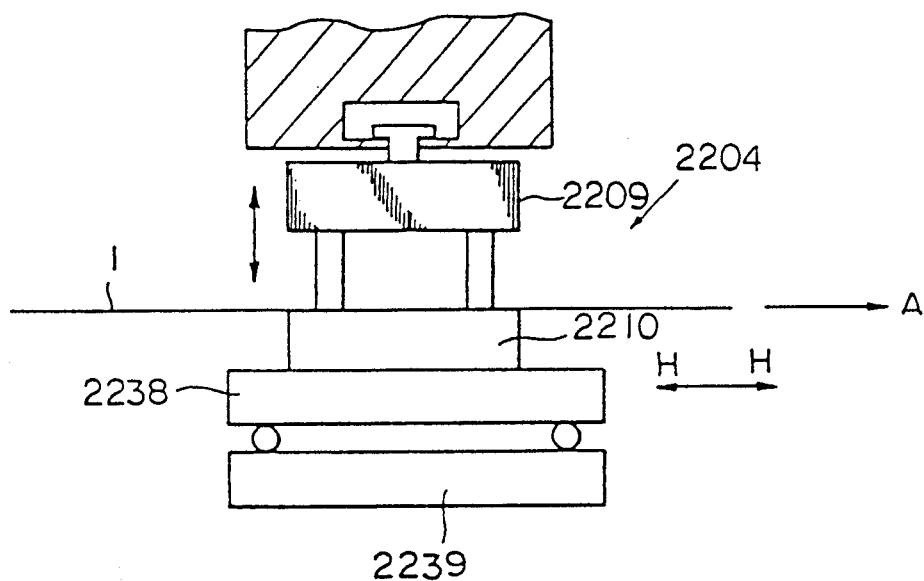

Although the position of the positioning pins 2219 of the upper mold 2209 is changed in the above explanation as a method of changing the perforating position of the reference hole 4, a method shown in FIG. 12 may be used. With this method, the metal mold 2204 composed of the upper mold 2209 and the lower mold 2210 is fixed in its entirety on a slider 2238, which slider is adapted to be reciprocated on a fixed base block 2239 parallel to the clad material 1 in the H-H direction. If the perforating position of the reference hole 4 is to be changed, the metal mold 2204 in its entirety is moved with respect to the clad material 1.

As another method for changing the perforating position of the reference hole 4, the positioning pins and the metal mold are both fixed and the clad material is moved for performing a positional adjustment. FIGS. 13a to 13d illustrate typical means for executing the method in the present example.

With the present method, both the upper mold 2209 and the lower mold 2210 are stationary and the clad material 1 is transported between the molds. The clad material 1 is intermittently transported by the air feeder 2208 (see FIG. 9) as in the above described method. However, with the present means, the clad material 1 is adapted to be moved for position adjustment not only by the air feeder 2208 but also by transport means for fine adjustment, such as a servo motor, not shown.

For boring the reference hole in the clad material by the perforating punch 2218 mounted on the upper mold 2209, the upper mold 2209 is lowered until the guide pins 2219 attached thereto are introduced halfway into the previously bored reference holes 4 (FIG. 13b). Should the position of the reference hole 4 be deviate beyond an allowable range, the servo motor is set into operation from the state shown in FIG. 13b for shifting the clad material 1 in a direction of correcting for the deviations. FIG. 13c shows the clad material having been shifted towards right. Since the guide pins 2219 have been intruded into the reference holes 4, the range of movement of the clad material 1 is within the gap defined between the reference holes 4 and the guide pins 2219. After the position of the clad material 1 has been corrected in this manner, the upper mold 2209, which has so far been halted, is again lowered for boring the reference hole by the perforating punch 2218 at the accurate position.

The above described means and method for adjusting the reference hole position may be applied to any other material besides the clad material.

Figure 17:
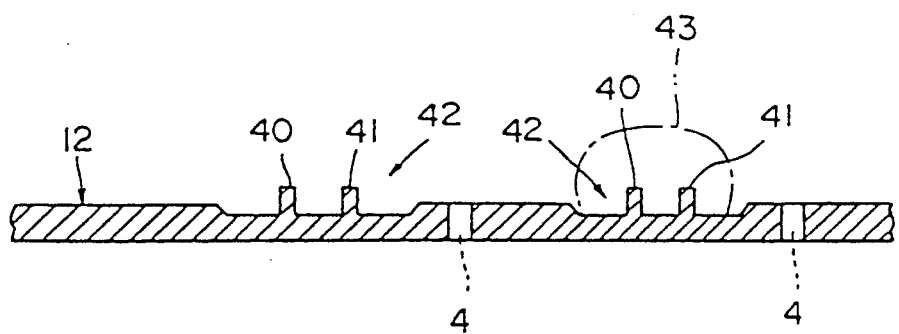
FIG. 17 is a side view of the strip.

For example, when processing a strip-like material W by coining, a recess 42 having two pins 40 and 41 is formed in a strip-like material W, and the so formed strip-like material 12 is used as a forming member S. The strip-like material 12 of the present embodiment is used in the next step for fitting a suitable product 43 by pins 40 and 41 with the reference holes 4 as the reference, as shown in FIG. 17.

Figure 18:
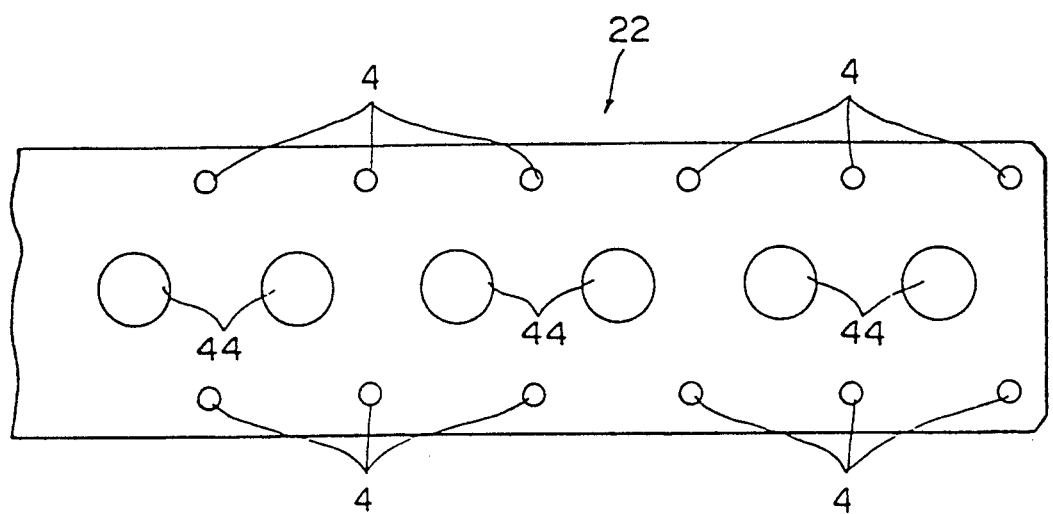
FIG. 18 is a plan view showing another embodiment of application of the invention concerning adjustment of the reference hole position to the working of a strip other than a clad matieral.
Figure 19:
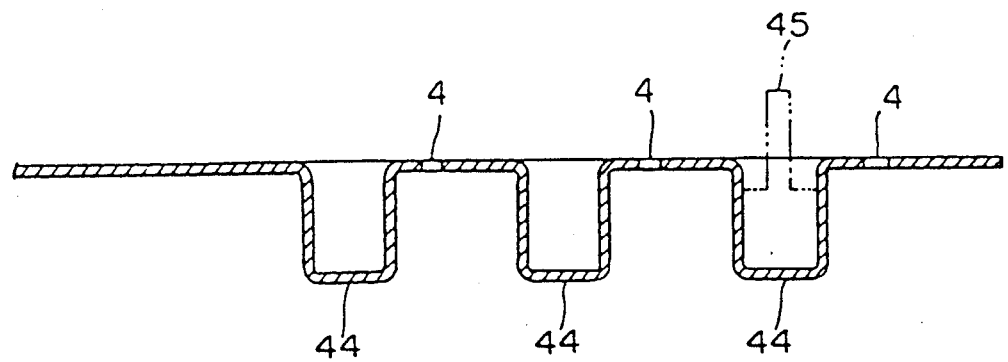
FIG. 19 is a cross-sectional side view thereof.

A recess 44 is formed in a strip like material 22 by drawing as shown in FIG. 18 so as to be used as a forming member S. With the present strip like material 22, a product 45 shown in FIG. 19 is introduced in the next step into the recess 44 with the reference hole 4 as the reference.

Method and Apparatus for Press Working

Figure 20:
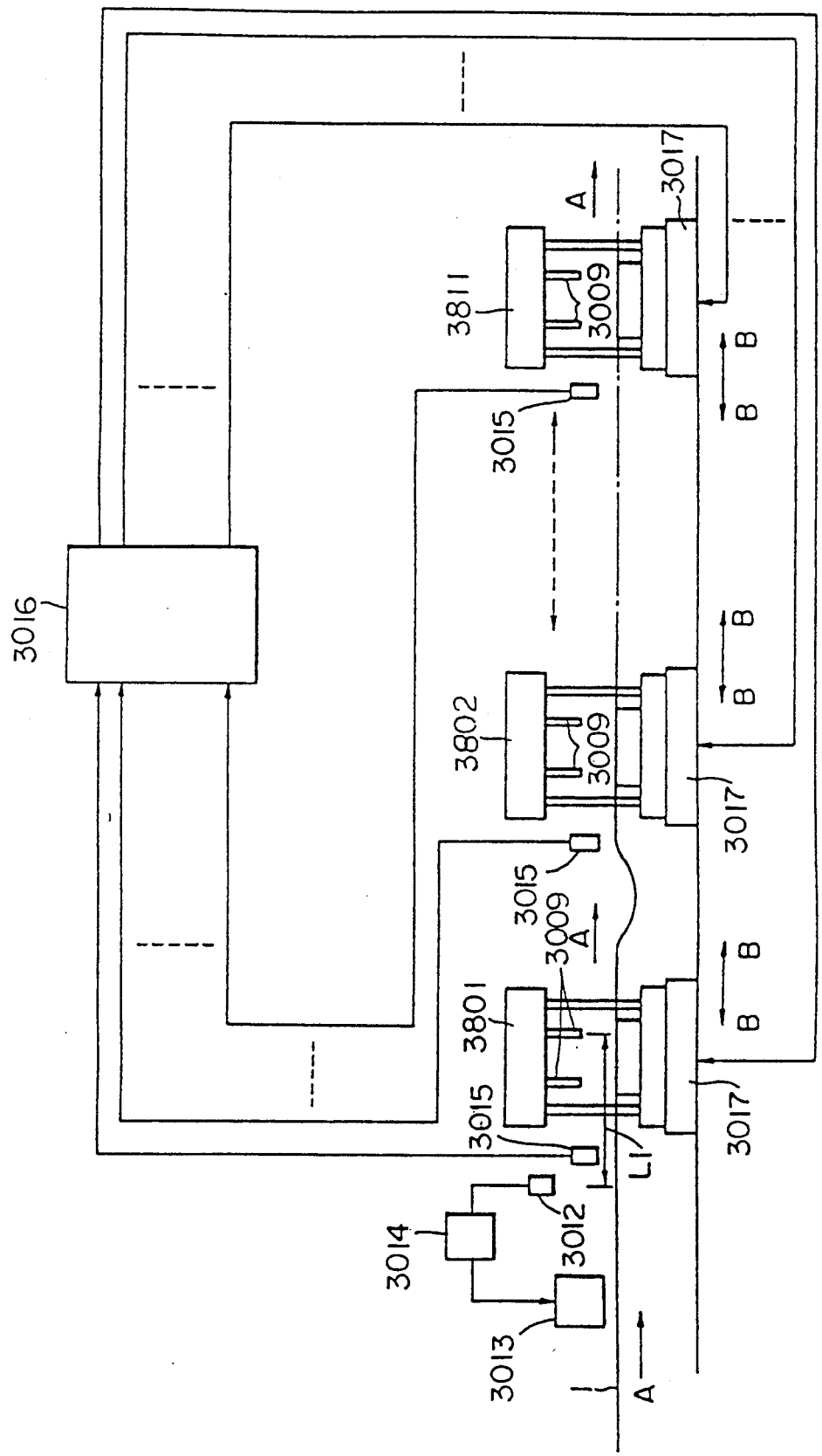
Figure 21:
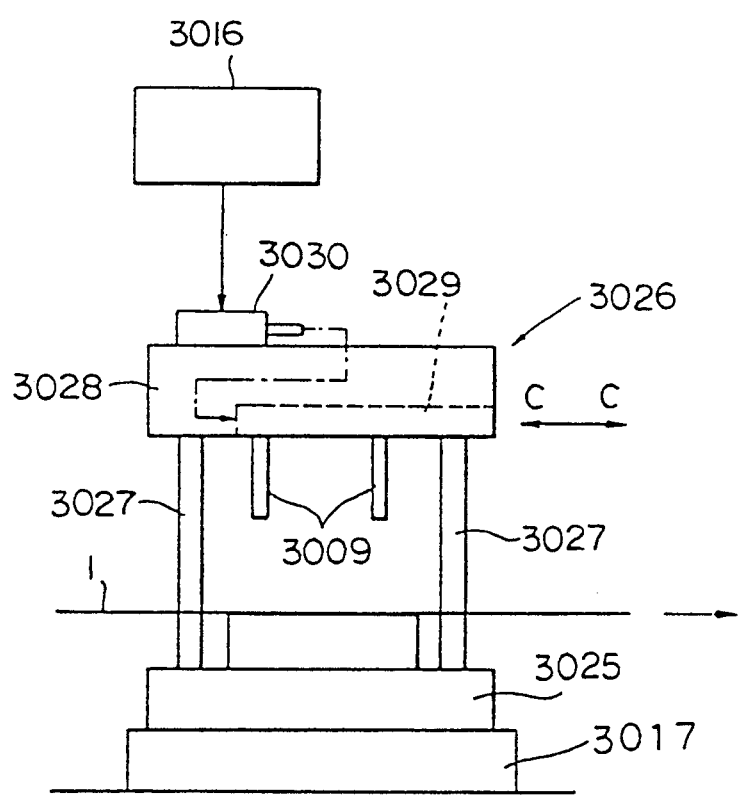
Figure 22:
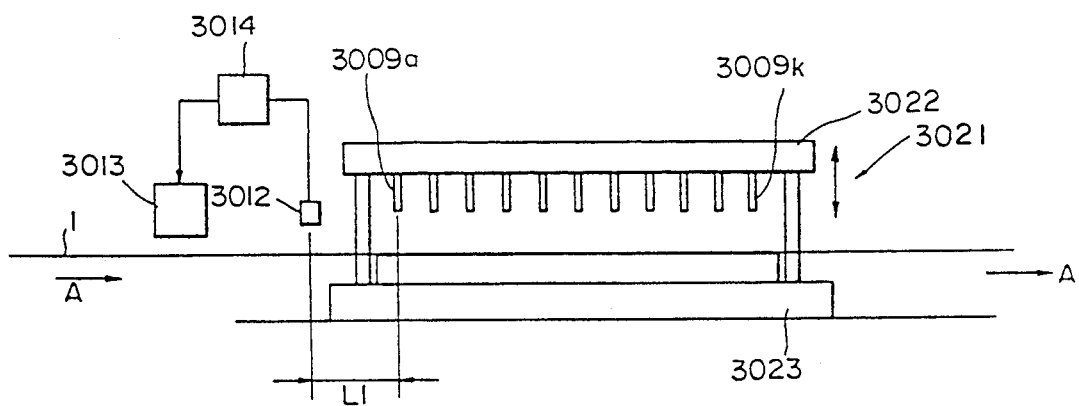
FIG. 22 is a schematic side view of a modification of the apparatus.

Referring to FIGS. 20 to 22, a press working apparatus for press-working a partial spot clad material is hereinafter explained.

In FIG. 20, transports means, not shown, transport the spot clad or partially clad material 1, in which the reference holes have been bored by the above described reference hole position adjustment process. The material 1 is intermittently transported towards right (in the A−direction) at a constant interval.

Figure 26:
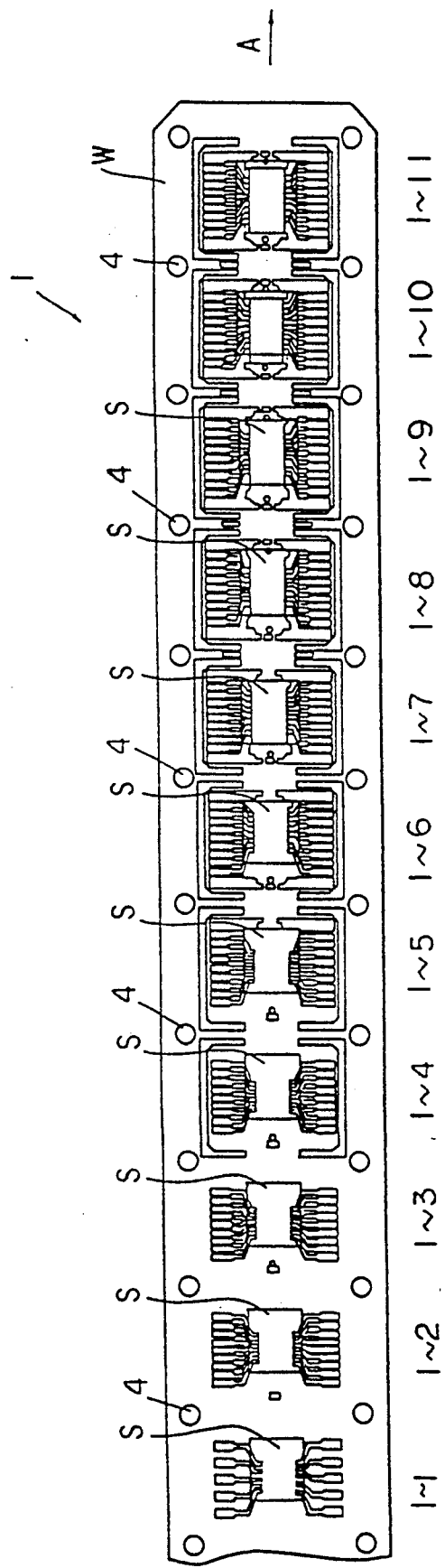
FIG. 26 is a plan view showing an embodiment of a cladding.

A plurality of, herein eleven, metal molds 3801, 3802, . . ., 3811, are provided downstream of the transport direction for the clad material 1. The metal molds 3801 to 3811 are each provided with four positioning pins 3009 (in the drawing, these pins located at a recessed position in the direction normal to the drawing sheet are hidden by those located towards the front side). The transported clad material 1 is fed sequentially into the metal molds 3801, 3082, . . ., 3811 so as to be press-worked in eleven stages by these metal molds. A reed frame for an IC board such as shown in FIG. 26 is formed by the press-working process. The numerals I-1, I-2, . . ., I-11 shown on the lower side in FIG. 26 indicate which number of the press-working process has been terminated.

Figure 23:
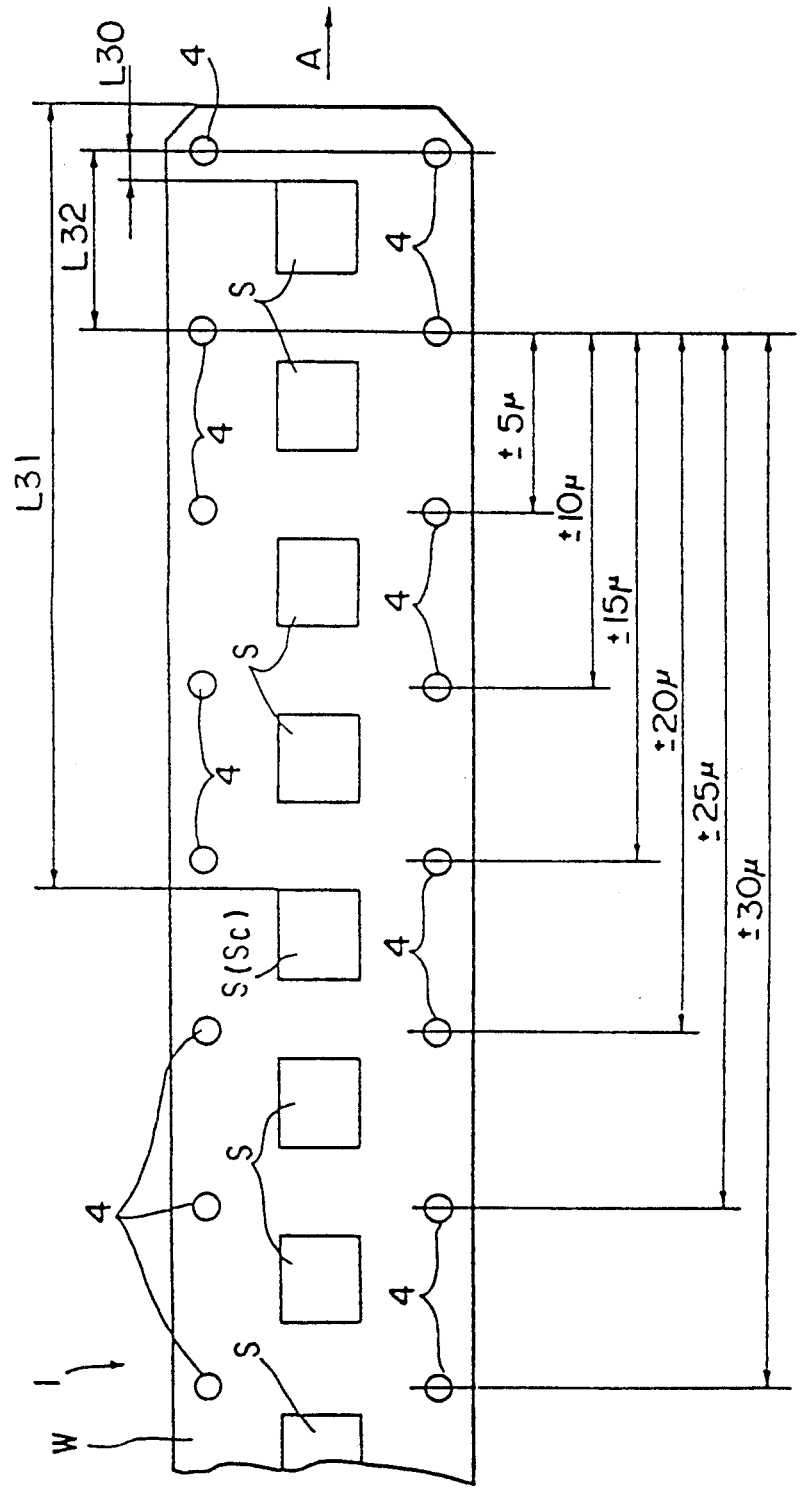
FIG. 23 is an illustrative view of a method according to the fifth aspect of the present invention.

In the course of the above described press working operation, the reference pins 3009 in each metal mold are engaged in the reference holes 4 in the clad material 1 for positioning the Al foil S on the clad material 1 with respect to the metal molds 3801 etc. Since the pitch of the reference holes 4 in the clad material 1 fed into the metal molds is cumulatively fluctuated, as shown in FIG. 23, it may occur that, if the positions of the reference pins 3009 within each of the metal molds 3801, 3802, . . . are perpetually fixed, the reference pins 3009 can not be engaged accurately in the reference holes 4, the positions of which are fluctuated cumulatively. For avoiding this, the following measures are used in the present embodiment.

In FIG. 20, a locating TV camera 3012 and a monitor 3013 are provided on the upstream side (on the left side) of the first metal mold 3801. The locating TV camera 3012 picks up an image of the clad material 1 transported therebelow to output the image in the form of video signals to a monitor driving circuit 3014. The monitor driving circuit 3014 causes the image of the clad material to be displayed on the monitor 3013 based on the information from the camera 3012, while simultaneously causing two locating lines 2225, spaced apart from each other by 20 μm, to be displayed, as in the above described monitor 2224 (see FIG. 15).

The locating TV camera 3012, monitor 3013 and the monitor driving circuit 3014 make up a monitoring means.

Referring again to FIG. 20, the metal molds 3801, 3802, ..., 3811 are each placed on a movable table 3017. These movable tables 3017 may be adjusted in their positions in a B-B direction parallel to the transport direction A for the clad material 1.

A position adjusting TV camera 3015 is provided on the directly upstream side of each of the metal molds 3801, 3802, ..., 3811. These cameras 3015 pick up the image of the clad material transported therebelow to output the image to a controlling means 3016 in the form of video signals. The controlling means 3016 causes the movable tables 3017 to be respectively moved based on the video signals supplied from the camera 3015.

The press working method to be executed by the above described press working apparatus is hereinafter explained in detail.

(1) Locating Step for Clad Material

In press-working the Al foil S by the first metal mold 3801, it is necessary to adjust the positioning pin 3009 of the metal mold accurately with respect to the first reference hole 4 in the clad material 1.

In the present embodiment, the operator feeds the clad material 1 shown in FIG. 23 manually into a metal mold 3801, as he views the monitor 3013 in order to check for the feeding operation. When the foremost part of the clad material 1 reaches the metal mold 3801, the Al foil Sc, which is located away from the foremost part of the clad material by a distance equal to a distance L31 between the positioning pin 3009 and the locating TV camera 3012 (see FIG. 23) is displayed on the monitor 3013, as in FIG. 15. The operator then causes the clad material 1 to be positioned so that the forward end of the Al foil Sc is situated between the two locating lines 2225 displayed on the monitor 3013. Thus the reference pins 3009 of the first metal mold 3801 are brought into coincidence with the first reference holes 4 in the clad material 1.

After termination of position setting of the clad material 1, the operator issues a command to the controlling means 3016, whereby an automatic transport of the clad material 1 and the press working by the metal molds 3801, 3802, ... are initiated.

(2) Reference Hole Position Adjustment Step

Turning to FIG. 20, the position adjustment TV cameras 3015, provided on the upstream side of the metal molds 3801, 3802, ... transmits an image of the clad material 1, in which the reference holes 4 have been bored, to the controlling means 3016, which then calculates, based on corresponding video signals, a pitch distance L32 of two adjacent reference holes 4 in the clad material 1 (see FIG. 23). This operation is performed for each of the n-number of pitch intervals, where n is a natural number which is arbitrarily set in dependence upon the positional accuracy of the reference holes 4 formed in the clad material 1 and which may be set so as to be equal to 5 (n=5).

In a data table within the controlling means 3016, the target values for the pitch intervals between the reference holes 4 is stored. The n-number of the reference hole pitch intervals L32, calculated as above, are compared respectively to the target value to calculate the deviations from the target value. A mean value of the produced n-number of the deviations is calculated.

In the data table, there is also stored, in addition to the target pitch intervals, an allowable limit value indicating to which extent the pitch interval of the reference holes 4 may be deviated. The deviation in the pitch interval of the reference holes 4, calculated as above, is compared to the allowable limit value.

The above operation is performed for each of data from the TV cameras 3015, that is, for each of the metal molds 3801, 3802, ....

If, as a result of comparison, the amount of deviation of the pitch interval of the reference holes (mean value) is found to be in excess of the allowable limit value, those movable tables 3017 associated with the metal molds 3801, 3802, ... having the pitch deviation (mean value) without the allowable limit value are respectively adjusted in their positions in the B-B direction. The result is that the reference pins 3009 of the metal molds 3801, 3802, ... may be accurately coincided with the reference holes 4 in the clad material 1 to assure press working of the Al foils S at a correct position.

In the above embodiment, a method of simultaneously displacing the metal molds in their entirety, that is the upper molds and the lower molds, by the movable tables 3017, has been used as means for changing the relative position between the reference pins 3009 and the reference holes 4 based on the results of processing by the controlling means. However, instead of this method, a method of fixing the lower molds and displacing only the upper molds or only the reference pins in the upper molds, may be used.

FIG. 21 schematically shows an example of the means for effectuating the latter method. With the present means, a lower mold 3025 is fixed. An upper mold 3026 is constituted by a main body of an upper mold 3028 and a slider 3029 mounted on the main body 3028. The main body of the upper mold 3028 is movable vertically along a guide rod 3027 but is not movable transversely. The slider 3029 is mounted on the main body of the upper mold 3028 for movement parallel to the transport direction of the clad material indicated by arrows C-C. Reference pins 3009 are provided on the bottom of slider 3029. A pneumatic cylinder 3030 is provided at a suitable position on the main body of the upper mold 3028. It is by this pneumatic cylinder 3030 that the slider 3029 is driven in the C-C direction.

The movable table 3017 and the slider 3029 are conjointly termed movable members.

Should it become necessary to change the position of the reference pins 3009 as a function of the deviation of the positions of the reference pins 3009, the pneumatic cylinder 3030 is actuated responsive to a command from the controlling means 3016 to displace the slider 3029 to displace the reference pins 3009 to an optimum position.

As a method for modifying the relative position between the reference pins 3009 and the reference holes 4, a method of fixing the metal molds in their entirety and displacing the clad material 1 suitably for positional adjustment, may be employed. In this case, means for displacing the clad material by small steps with high accuracy for positional adjustment, such as driving means by a servo motor, must be provided in addition to a clad material transport means for transporting the clad material 1 for positional adjustment.

FIG. 22 shows an example of the preferred form concerning a press working device.

Although eleven separate metal molds 3801, 3802, . . . , 3811 are arranged in tandem in the embodiment of FIG. 20, a straightforward type metal mold 3021 having eleven press working stages is used in an apparatus shown in FIG. 22 to perform press working. Meanwhile, in the case of the clad material 1 fed into the metal mold 3021, the pitch distance L32 of the reference holes 4 is cumulatively changed, as shown in FIG. 23, as in the embodiment shown in FIG. 20, and the clad material 1, taken out from the mold 3021, is press worked, as shown in FIG. 26.

Referring to FIG. 22, the straightforward type metal mold 3021 includes an upper metal mold 3022 and a lower metal mold 3023. The upper mold 3022 has eleven pairs of reference pins $3009a$ to $3009k$. Each of the reference pin pairs $3009a$, $3009b$, . . ., $3009k$ is constituted by two reference pins arrayed along the width of the clad material 1, that is in the direction normal to the drawing sheet. In the figure, only the front side reference pins of the pin pairs are shown, while the recessed reference pins are hidden from view.

In the present embodiment, the reference holes 4 in the clad material 1 (FIG. 23) are set to a diameter of 4,000 μm (4 mm). On the other hand, the reference pins are set to the following diameters:

| | |
|---|---|
| 3009a, 3009b | 3,990 μm |
| 3009c, 3009d | 3,985 μm |
| 3009e, 3009f | 3,980 μm |
| 3009g, 3009h | 3,975 μm |
| 3009i, 3009j | 3,970 μm |
| 3009k | 3,965 μm |

That is, the reference pin diameters become larger towards the upstream side relative to the transporting direction of the clad material 1.

Directly upstream of the straightforward type metal mold 3021, a monitoring means constituted by a locating TV camera 3012, a monitor 3013 and a monitor driving circuit 3014 are provided, as in the embodiment shown in FIG. 20.

For press working the clad material 1 by the present apparatus, the clad material 1 is located, that is, the position of the first reference pin $3009a$ is adjusted with respect to the reference hole 4 in the clad material 1, by the same operation as that for the system shown in FIG. 20.

After the locating operation is terminated, the clad material 1 is automatically fed at a constant pitch in a direction shown by an arrow A, and the upper mold 3022 is reciprocated vertically at a constant timing. When the upper metal mold 3022 i lowered, press working on the Al foil S on the clad material 1 is executed.

During press working by the upper mold 3022, the reference pins $3009a$ to $3009k$ are intruded into the reference holes 4 in the clad material 1 for correctly positioning the Al foil S on the clad material 1 with respect to the metal mold 3021. In this case, the pitch distance of the reference holes 4 in the clad material 1 is cumulatively changed, as shown in FIG. 23. Therefore, if the reference pins $3009a$ to $3009k$ in the metal mold 3021 are of the same pin diameter, downstream side reference pins $3009k$ etc. may not be accurately engaged in the reference holes 4, even if upstream side reference pins $3009a$ etc. are accurately engaged in the reference holes 4. In such case, the reference pins may be broken or the press working may not be carried out at the correct positions at the downstream press working stages.

However, in the present apparatus, since the reference pins $3009a$ to $3009k$ are of decreasing diameters towards the downstream side, the reference pins are unexceptionally engaged correctly in the reference holes 4, even if the reference holes 4 in the clad material 1 are cumulatively changed. As a result, normal press working may be carried out continuously.

Meanwhile, the press working method and apparatus may be modified from the preferred forms described above.

In the above explanation, the pitch distances of the reference holes 4 formed in the clad material 1 are assumed to be cumulatively changed, as shown in FIG. 23. However, any other mode of changes of the pitch distances of the reference holes than the cumulative mode may be coped with.

Although the position adjustment TV camera 3015 are respectively allocated to the metal molds 3801 to 3811, it is possible to provide a TV camera 3015 only on the upstream side of the first metal mold 3801, and to perform positional adjustment of the metal molds 3801, 3802, . . ., 3811 based on the data of the clad material picked up by the camera. Method and apparatus for Concurrent Reference Hole Position Adjustment and Press Working FIG. 24 shows a working apparatus for a clad material in which, when reference holes are bored in the clad material on which a metal foil is applied previously, not only the relative position between the reference holes but also the relative position between the reference holes and the metal foils previously applied to the clad material may be accurately set, and press working of the reference holes may be executed simultaneously.

Figure 24:
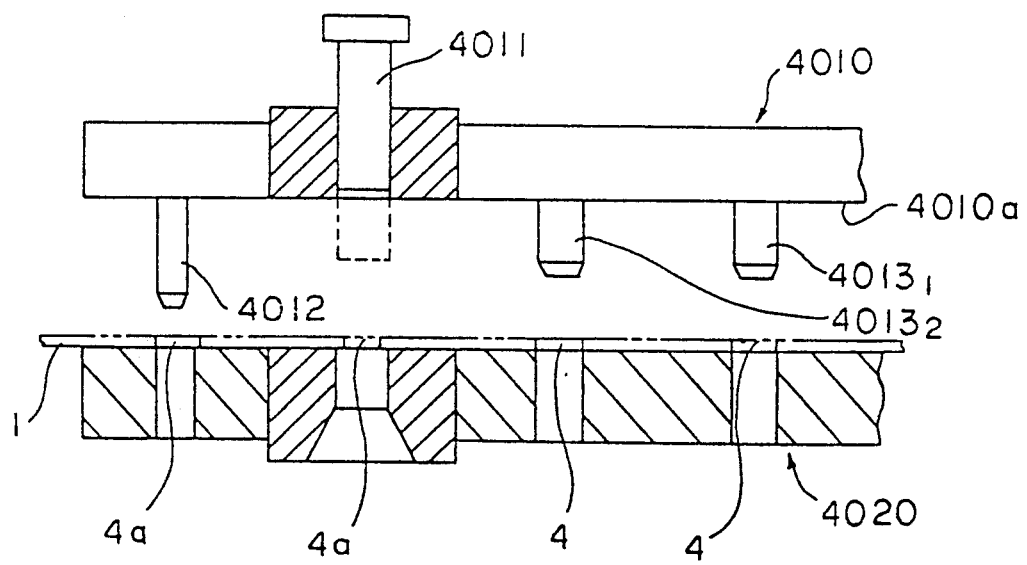
FIG. 24 is a schematic view showing a preferred form of an apparatus according to the eighth aspect of the present invention.

As shown in FIG. 24, the press mold is constituted by a vertically movable upper mold 4010 and a lower mold 4020 forming a counterpart of the upper mold. The upper mold 4010 is provided with a perforating punch 4011 adapted for projecting from or receding below a reference surface $4010a$. The perforating punch 4011 is adapted for re-boring a spare reference hole $4a$ into a circular reference hole 4. Vertical movement of the upper metal mold 4010 and projection as well as recession of the perforating punch 4011 with respect to the reference surface $4010a$ are taken charge of by respective driving means, not shown.

On the upstream side of the perforating punch 4011 on the reference surface $4010a$ of the upper mold 4010, there is provided a correcting pin 4012 which may be reinserted in the reference $4a$ yet to be re-bored, while, on the downstream side of the perforating punch 4011, a plurality of (an x number) of guide pins $4013_1$ to $4013X$, which may be reinserted into the re-bored reference holes 4, are mounted upright at a predetermined pitch.

The relative lengths of the perforating punch 4011, correcting pins 4012 and the guide pins 4013, provided in the upper mold 4010, are set such that the lengths as from the reference surface (the projecting length for the punch) are related to one another by the formula punch 4011 < guide pin 4013 < correcting pin 4012 while the maximum lengths along the feed direction of the clad material are related to one another by the formula punch 4011 < guide pin 4013 < correcting pin 4012.

The perforating punch 4011 usually has a circular or cylindrical cross-sectional shape for re-boring the hole to a circular reference hole. On the other hand, the guide pin 4013 inserted into the re-bored reference hole 4 also has a circular or cylindrical cross-sectional shape. However, the shape of the correcting pin 4012 is determined by that of the reference hole 4a yet to be re-bored.

That is, if the reference hole 4a before re-boring has a square shape, it is possible to use a circular correcting pin 4012 similar to a circle inscribing the reference hole 4a. However, with a rectangular reference hole 4a having a long side along the feed direction (longitudinal direction) of the clad material, the diameter of the correcting pin 4012 is governed by the short side of the reference hole 4a (the length thereof in a direction normal to the feed direction of the clad material) such that it becomes difficult to provide a suitable play for absorbing various cumulative errors characteristic of the present apparatus.

Therefore, in such case, the correcting pin 4012 is preferably of a square prism or a square hollow shape having a rectangular transverse cross section similar to the square shape of the reference hole 4a.

In the case of a rectangular reference hole 4a having a short side in the feed direction of the clad material, the correcting pin 4012 having a circular transverse cross-section may be used because the pin diameter is not governed by the long side of the reference hole 4a (the size in a direction normal to the feed direction of the clad material). Also the correcting pin 4012 having a rectangular cross-section may naturally be employed.

As described above, the transverse cross-section of the correcting pin 4012, such as that of a rectangle or a circle must be selected suitably as a function of the shape of the reference hole 4a which is to be re-bored. For any shape of the correcting pin 4012, the maximum length along the feed direction of the clad material of the correcting pin 4012 (the length of a side along the feed direction of a clad material if the pin 4012 has rectangular cross-section, and the diameter of the pin 4012 if the pin has a circular transverse cross-section) must to be shorter than the maximum length along the feed direction of the clad material of the reference hole 4a which is to be re-bored, while it must to be slightly shorter than the range of an allowable error of a reed frame bonding area for the subsequent bonding process.

On the other hand, the correcting pin 4012 is to be shorter than the maximum length or diameter along the feed direction of the clad material of the reference hole 4a before re-boring, while it is to be slightly shorter than the range of an allowable error of a reed frame bonding area for the subsequent bonding process.

The guide-pins $4013_1$ to $4013x$ have slightly smaller diameters than the diameter of the re-bored reference hole 4 to provide an allowance to absorb cumulative errors such as a deviation between an original size and a measured size.

It will be seen from above that the maximum lengths along the feed direction of the clad material of the pins and the punch are determined by the maximum length along the feed direction of the clad material of the reference hole 4a yet to be re bored and the re bored reference hole 4.

The method for positional adjustment of the reference holes and for press working by the above described apparatus will be hereinafter explained.

The clad material 1 from the clad material production process is supplied to the metal mold shown in FIG. 24 by an inching feed means, not shown.

When the clad material 1 is supplied by the inching device onto the lower metal mold 4020 of the above mentioned press metal mold, provided with a large number of holes at a predetermined reference hole pitch, the upper metal mold 4010 is lowered for perforating the reference hole 4.

First, with the lowering of the upper mold 4010, the correcting pin 4012 is introduced into the reference hole 4a which is to be re-bored. If the reference hole 4a is subject to an error due to partial deviation, the error is corrected mechanically by the intrusion of the pin 4012 into the reference hole (FIG. 25a).

Figure 25:
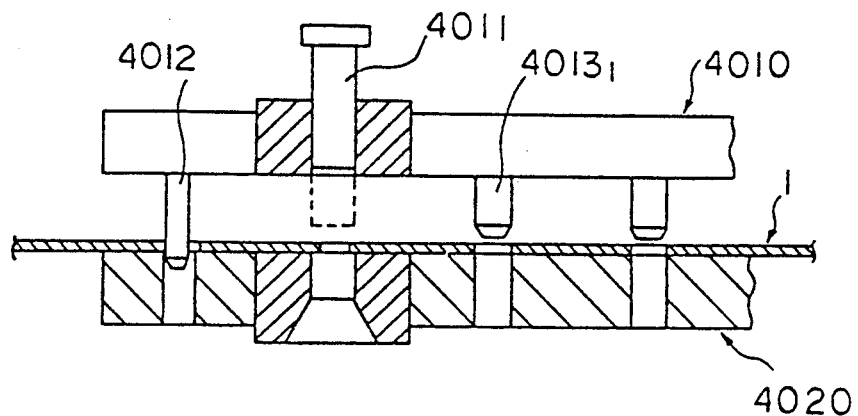
FIGS. 25 (a) and (b) are illustrative views showing a method according to the seventh aspect of the present invention.
Figure 25:
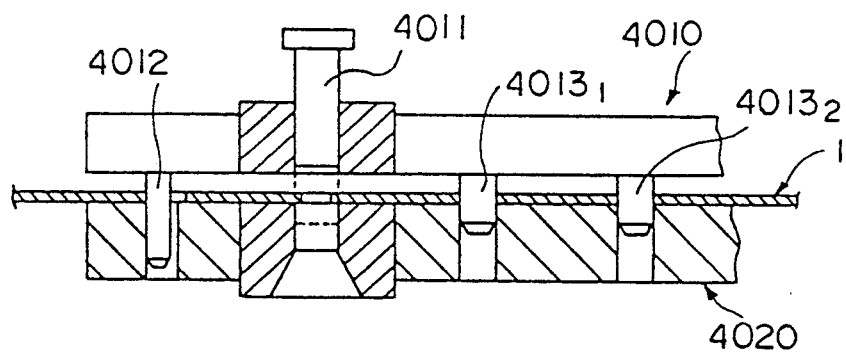
Figure 25:
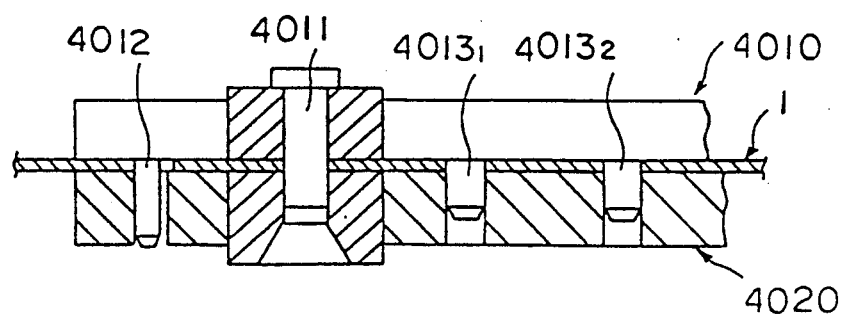

When the upper metal mold 10 is lowered further, the guide pins $4013_1$ to $4013x$ are are introduced into a large number of the re-bored reference holes 4 for positioning, such that the cumulative error such as a deviation between the original size and the measured size is absorbed by the play (error) provided by the guide pins 4013, to 4013x in their entirety (FIG. 25b).

The upper mold 4010 is lowered further for re boring the reference hole 4a corrected mechanically during the preceding press working as mentioned above by the perforating punch 4011 to complete the reference hole 4 as shown in FIG. 25c.

By repetition of the above described press working operations, the cumulative error of the pitch of the reference hole 4 and the metal foil S may be absorbed so as to be equal to or less than the pitch between the metal foils S without the necessity of measuring the pitch between the metal foil S and the reference hole 4.

Thus the clad material 1 is obtained in which the reference hole 4 is pitch-controlled within an allowable error of the bonding area at the time of processing into a reed frame.

On the other hand, if the correcting pin 4012 is not introduced into the reference hole 4a which is to be re-bored, that is if a large error is caused in the pitch of the reference hole 4a and the metal foil S, this state is sensed and accordingly the correcting pin 4012 is brought to a raised position. The reference hole 4a mechanically corrected during the preceding press-working process is re-bored by the perforating punch 4011 to prevent a continuous press-working process from being interrupted.

After termination of the above described continuous press-working operation, the shape of the re-bored reference hole 4 is measured and detected by an optical sensor etc. for eliminating any defective portion with profiled reference holes 4 and reference holes which are to be re bored with obvious advantages for industrial production.

According to the present working method, when a reference hole is to be bored in the clad material on which metal foils are formed in advance, not only the relative disposition between the reference holes but also the relative disposition between the reference holes and the metal foils previously applied on the clad material may be set accurately, and the reference holes are finished simultaneously.

Industrial Utilizability

As described in the foregoing, the method and the apparatus for working the clad material according to the present invention may be advantageously used for producing a reed frame for a flat package type integrated circuit.

We claim:

1. A method for producing a clad material by spot cladding a metal foil on a strip-like material comprising,
   a material feeding step for feeding said strip-like material to a working position by predetermined lengths,
   a metal foil feeding step for sucking said metal foil by a movable suction member and feeding the metal foil to said working position,
   a metal foil positioning step of re-sucking said metal foil by a fixed suction member and setting the metal foil in position on a surface of said strip-like material,
   a cutting step of cutting said metal foil to a predetermined size to form metal foil pieces,
   a tacking step of tacking said metal foil pieces on said material, and
   a rolling step of pressure contacting and rolling the tacked metal foils and the material.

2. A method according to claim 1, further comprising,
   a locating step of setting a relative position between a position of each metal foil piece on said clad material and a position of each reference hole to be bored,
   a reference hole punching step of each reference hole in register with the position of said metal foil piece,
   a hole position measuring step of measuring a distance of an n number of the bored reference holes from one bored reference hole to one metal foil piece, where n is a natural number,
   a calculating step of performing an arithmetic operation on the n number of the measured data, and
   a reference hole position adjustment step of modifying the boring positions for said metal foil pieces in case a value of the arithmetic operation are outside a predetermined range.

3. A method according to claim 2, further comprising,
   a reference hole locating step for setting an initial working position for said foil piece on the strip-like material,
   a hole pitch measuring step of measuring an n number of pitch distances between said reference holes,
   a calculating step for performing an arithmetic operation of the measured n number of the pitch distance, and
   a position adjustment step of modifying a relative position between reference pins and said reference holes on a basis of results of said arithmetic operation.

4. A method according to claim 1, further comprising,
   boring reference holes with position adjustment in said strip-like material,
   preparing a press-working metal mold provided with a correcting pin, a perforating punch and a guide pin arranged in this order as viewed from an upstream side of transfer of the strip-like material, lengths of the pins and the punch being correlated such that the guide pin is greater than the perforating punch but less than the correcting pin and maximum lengths of said pins and the punch as viewed in the material feed direction being correlated such that the guide pin is greater than the correcting pin but less than the perforating punch,
   lowering said press-working metal mold for introducing said correcting pin into one reference hole bored already and before re-boring for mechanically correcting an error of partial deviation of said reference hole,
   introducing and positioning said guide pin in a reference hole re-bored already, and
   re-boring one reference hole, a position of which was corrected during the preceding press-working, by said perforating punch.

5. An apparatus for working a clad material comprising,
   material supplying means for supplying a trip-like material,
   material feeding means operatively associated with said material supplying means for feeding the material from said material supplying means by a predetermined length,
   metal foil supplying means for supplying a strip-like metal foil,
   metal foil feeding means operatively associated with said meal foil supplying means for feeding a metal foil from said metal foil supplying means by a predetermined length, said metal foil being located above the strip-like material,
   cutting and tacking means for cutting the metal foil transferred by the metal foil feeding means to produce metal foil pieces, said cutting and tacking means placing the metal foil pieces on an upper surface of the material and tacking said metal foils on said upper surface, and
   rolling means situated near the cutting and tacking means for pressure contacting and rolling the tacked metal foil pieces over said material.

6. An apparatus according to claim 5, further comprising a device for providing working reference holes, said device being arranged on a downstream side of the rolling means and including:
   monitoring means for determining relation between a position of each metal foil piece on said material and a position of each reference hole to be bored,
   a metal mold disposed adjacent to the monitoring means for punching the reference holes in the strip-like material near said metal foil pieces,
   a TV camera located adjacent to the metal mold for measuring a distance of an n number of the bored reference holes from one bored reference hole to one metal foil piece, wherein n is a natural number,
   controlling means operatively associated with the TV camera for performing an arithmetic operation on the n number of the measured distance, and
   a cam operatively connected to the controlling means for modifying and adjusting a boring position for said metal foil piece based on the results of said arithmetic operation.

7. An apparatus according to claim 6, further comprising a clad material working apparatus arranged downstream of the reference holes providing device, said clad material working apparatus comprising,
   monitoring means for locating one reference hole for setting an initial working position,
   a TV camera located adjacent to the monitoring means for measuring a distance of an n number of pitch distances of said reference holes, wherein n is a natural number, controlling means operatively associated with the TV camera for performing an arithmetic operation of the n number of measured hole pitch distance data, reference pins for engaging the reference holes in said clad material for positioning the foil pieces on said clad material with respect to a metal mold, and a movable member for supporting the reference pins, said movable member being operatively connected to the controlling means to be moved on the basis of the results of the arithmetic operation by said controlling means for modifying a relative position between said reference pins and said reference holes.

8. An apparatus according to claim 7, wherein diameters of said reference pins of the clad material working apparatus are changed by a predetermined amount with respect to positions of the reference pins along a transport direction of said clad material.

9. An apparatus according to claim 5, further comprising a working apparatus for a clad material arranged downstream of the rolling means for boring reference holes with positional adjustment in the clad material, said working apparatus comprising, a press-working metal mold including a correcting pin, a perforating punch and a guide pin arranged in this order from an upstream side of transfer of the clad material, lengths of the pins and the punch being correlated such that the guide pin is greater than the perforating punch but less than the correcting pin and maximum lengths of the pins and the punch in the material transfer direction being correlated such that the guide pin is greater than the correcting pin but less than the perforating punch, and driving means connected to the press-working metal mold for lowering said press-working metal mold so that the reference holes are formed.

10. A method of boring working reference holes in a strip material having working members thereon, comprising, a locating step of setting a position of a reference hole to be bored relative to a position of the working member, a reference hole punching step of punching the reference hole in register with the position relative to said working member, and subsequently punching a plurality of the reference holes, a hole position measuring step of measuring a distance of an n number of the bored reference holes from one bored reference hole to one working member, n being a natural number, a processing step of performing an arithmetic operation on the n number of the measured distance and comparing with a desired distance, and a reference hole position adjustment step of modifying and adjusting a boring position with respect to said working member on the basis of the arithmetic operation, and subsequently punching the reference hole at an adjusted position.

* * * * *